US012610836B2

(12) United States Patent
Harada et al.

(10) Patent No.: US 12,610,836 B2
(45) Date of Patent: Apr. 21, 2026

(54) SEMICONDUCTOR DEVICE

(71) Applicant: ROHM CO., LTD., Kyoto (JP)

(72) Inventors: Yusuke Harada, Kyoto (JP); Hiroyuki Shinkai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 789 days.

(21) Appl. No.: 17/930,087

(22) Filed: Sep. 7, 2022

(65) Prior Publication Data

US 2023/0083920 A1      Mar. 16, 2023

(30) Foreign Application Priority Data

Sep. 10, 2021    (JP) ................................. 2021-147837
Sep. 2, 2022    (JP) ................................. 2022-140094

(51) Int. Cl.
| | |
|---|---|
| *H01L 23/498* | (2006.01) |
| *H01L 23/00* | (2006.01) |
| *H01L 23/31* | (2006.01) |
| *H01L 23/36* | (2006.01) |

(52) U.S. Cl.
CPC .... *H01L 23/49838* (2013.01); *H01L 23/3121* (2013.01); *H01L 23/36* (2013.01); *H01L 24/05* (2013.01); *H01L 24/13* (2013.01); *H01L 2224/05647* (2013.01); *H01L 2224/13144* (2013.01); *H01L 2224/13147* (2013.01); *H01L 2224/13155* (2013.01); *H01L 2224/13164* (2013.01)

(58) Field of Classification Search
CPC ........... H01L 23/49838; H01L 23/3121; H01L 23/36; H01L 23/3107; H01L 23/49805
See application file for complete search history.

(56) References Cited

U.S. PATENT DOCUMENTS

| | | | | |
|---|---|---|---|---|
| 2006/0226542 A1* | 10/2006 | Chien | ..................... | H01L 24/02 |
| | | | | 257/737 |
| 2014/0312514 A1* | 10/2014 | Yasunaga | ................ | H01L 24/06 |
| | | | | 257/782 |
| 2017/0294387 A1* | 10/2017 | Kawabata | ............. | H01L 21/485 |
| 2019/0252290 A1* | 8/2019 | Nishimura | .............. | H01L 23/13 |
| 2019/0287890 A1* | 9/2019 | Harada | ............... | H01L 21/6835 |

FOREIGN PATENT DOCUMENTS

| | | | |
|---|---|---|---|
| JP | 2005317594 A | * | 11/2005 |
| JP | 2019057577 A | | 4/2019 |

* cited by examiner

*Primary Examiner* — Jeff W Natalini
*Assistant Examiner* — Rose Keagy
(74) *Attorney, Agent, or Firm* — HSML P.C.

(57) ABSTRACT

A semiconductor device includes an electrically insulating substrate including a substrate main surface and a substrate back surface facing opposite to each other in a thickness direction and at least one substrate side surface facing a direction intersecting the thickness direction, a semiconductor element arranged at a side of the substrate main surface, a heat-dissipating conductive portion that is provided at a position overlapping with at least a portion of the semiconductor element when viewed from the thickness direction and is exposed from the substrate back surface, a sealing resin that seals the semiconductor element while covering the substrate main surface, and at least one wiring portion that is connected to the heat-dissipating conductive portion, extends from the heat-dissipating conductive portion to the substrate side surface while being exposed from the substrate back surface, and is exposed from the substrate side surface.

16 Claims, 39 Drawing Sheets

SEMICONDUCTOR DEVICE

CROSS-REFERENCE TO RELATED APPLICATIONS

This application is based upon and claims the benefit of priority from Japanese Patent Application Nos. 2021-147837 and 2022-140094, filed on Sep. 10, 2021 and Sep. 2, 2022, respectively, the entire contents of which are incorporated herein by references.

TECHNICAL FIELD

The present disclosure relates to a semiconductor device.

BACKGROUND

With the recent miniaturization of electronic apparatuses, the miniaturization of semiconductor devices used in the electronic apparatuses has been progressing. Therefore, a so-called Fan-Out type semiconductor device has been proposed. This semiconductor device includes a semiconductor element having a plurality of electrodes, an insulating layer that covers a back surface on which the plurality of electrodes of the semiconductor element are formed, and a plurality of wirings that are formed on the insulating layer, electrically connected to the plurality of electrodes, and located outside the semiconductor element.

By the way, in the semiconductor device, since terminals connected to the plurality of wirings are exposed from the back surface of the insulating layer, when the semiconductor device is mounted on a wiring board by solder, it is difficult to visually recognize the solder from the outside of the semiconductor device. Therefore, there is room for improvement from the viewpoint of visually recognizing a mounting state of the semiconductor device on the wiring board from a bonding state of the semiconductor device and the wiring board by the solder.

SUMMARY

According to one embodiment of the present disclosure, a semiconductor device includes an electrically insulating substrate including a substrate main surface and a substrate back surface facing opposite to each other in a thickness direction and at least one substrate side surface facing a direction intersecting the thickness direction, a semiconductor element arranged at a side of the substrate main surface, a heat-dissipating conductive portion that is provided at a position overlapping with at least a portion of the semiconductor element when viewed from the thickness direction and is exposed from the substrate back surface, a sealing resin that seals the semiconductor element while covering the substrate main surface, and at least one wiring portion that is connected to the heat-dissipating conductive portion, extends from the heat-dissipating conductive portion to the substrate side surface while being exposed from the substrate back surface, and is exposed from the substrate side surface.

BRIEF DESCRIPTION OF DRAWINGS

The accompanying drawings, which are incorporated in and constitute a part of the specification, illustrate embodiments of the present disclosure.

FIG. 7 is a cross-sectional view taken along line 7-7 in FIG. 4.

FIG. 9 is a cross-sectional view taken along line 9-9 in FIG. 4.

FIG. 10A is a cross-sectional view schematically showing a state in which the semiconductor device of one embodiment is mounted at a wiring board.

FIG. 11A is a schematic cross-sectional view showing a process of manufacturing a semiconductor device.

FIG. 13A is a schematic cross-sectional view showing a process of manufacturing the semiconductor device.

FIG. 13B is a schematic cross-sectional view showing a process of manufacturing the semiconductor device.

FIG. 14A is a schematic cross-sectional view showing a process of manufacturing the semiconductor device.

FIG. 14B is a schematic cross-sectional view showing a process of manufacturing the semiconductor device.

FIG. 17A is a schematic cross-sectional view showing a process of manufacturing the semiconductor device.

FIG. 19A is a schematic cross-sectional view showing a process of manufacturing the semiconductor device.

FIG. 20A is a schematic cross-sectional view showing a process of manufacturing the semiconductor device.

FIG. 20B is a schematic cross-sectional view showing a process of manufacturing the semiconductor device.

FIG. 21A is a schematic cross-sectional view showing a process of manufacturing the semiconductor device.

FIG. 22A is a schematic cross-sectional view showing a process of manufacturing the semiconductor device.

FIG. 25 is a schematic cross-sectional view showing a semiconductor device of a modification.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments and modifications will now be described with reference to the drawings. The following embodiments and modifications are examples of configurations and methods for embodying the technical idea, and the materials, shapes, structures, arrangements, dimensions and the like of the respective components are not limited to the following. Various changes can be added to the following embodiments and modifications. The following embodiments and modifications can be implemented in combination unless technically contradictory.

In the present disclosure, "a state where a member A is connected to a member B" includes a case where the member A and the member B are physically directly connected and a case where the member A and the member B are indirectly connected through any other member that does not affect an electrical connection state.

Similarly, "a state where a member C is installed between a member A and a member B" includes a case where the member A and the member C or the member B and the member C are directly connected and a case where the member A and the member C or the member B and the member C are indirectly connected through any other member that does not affect an electrical connection state.

One Embodiment

Figure 1:
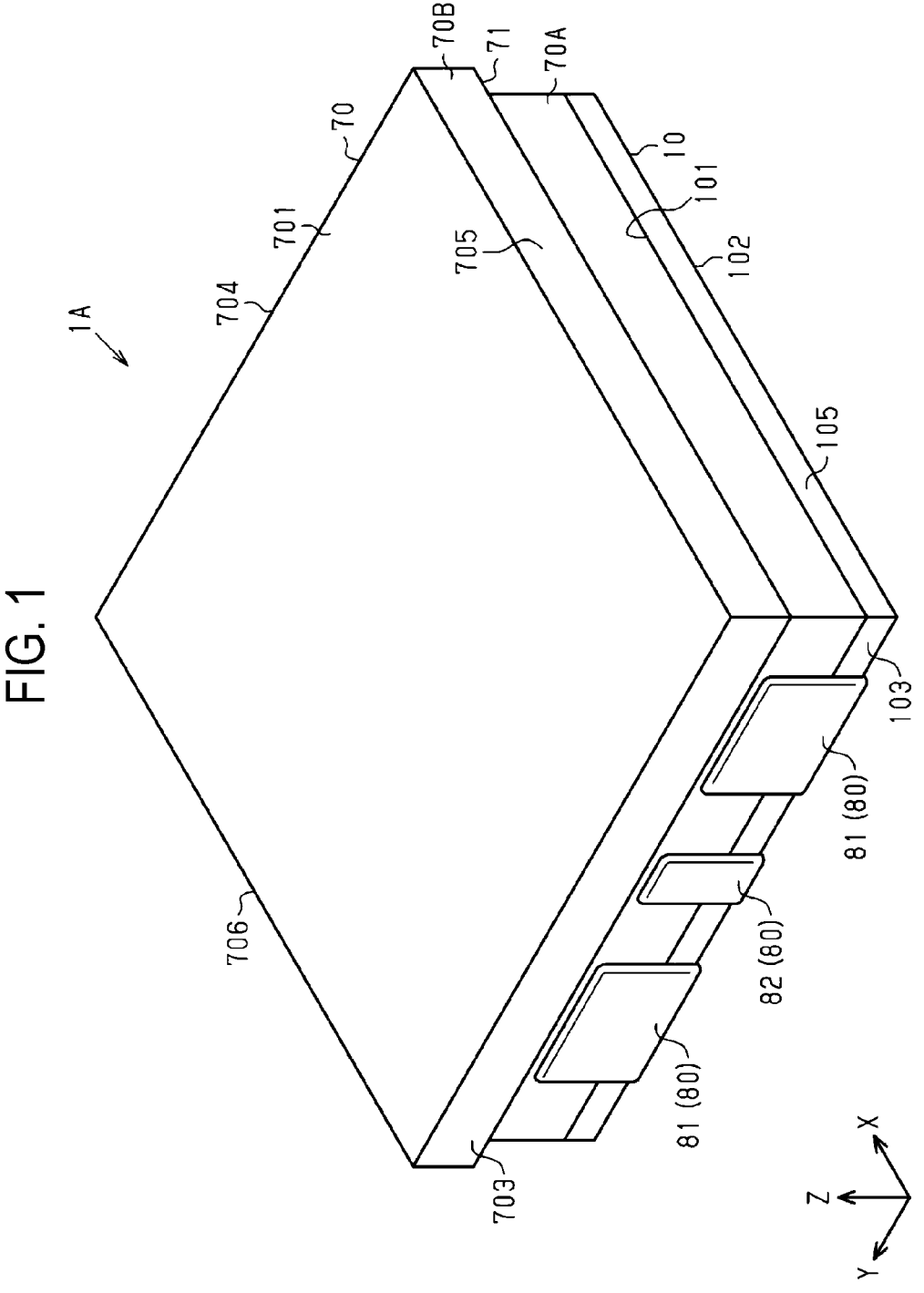
FIG. 1 is a perspective view of a semiconductor device of one embodiment as viewed from a top surface side.
Figure 2:
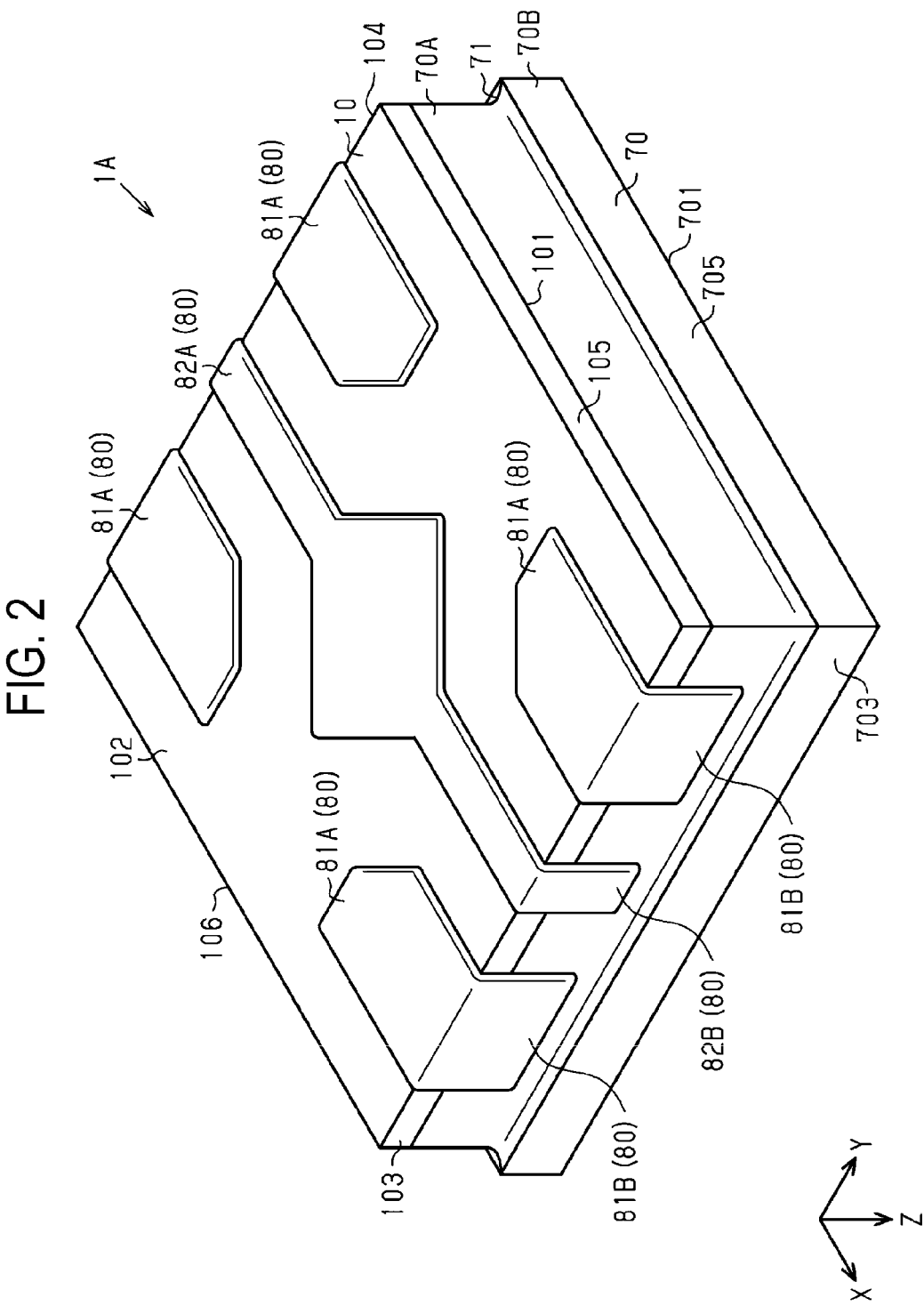
FIG. 2 is a perspective view of the semiconductor device of one embodiment as viewed from a lower surface side.
Figure 3:
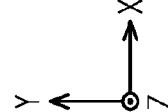
FIG. 3 is a schematic top view showing the semiconductor device of one embodiment.
Figure 4:
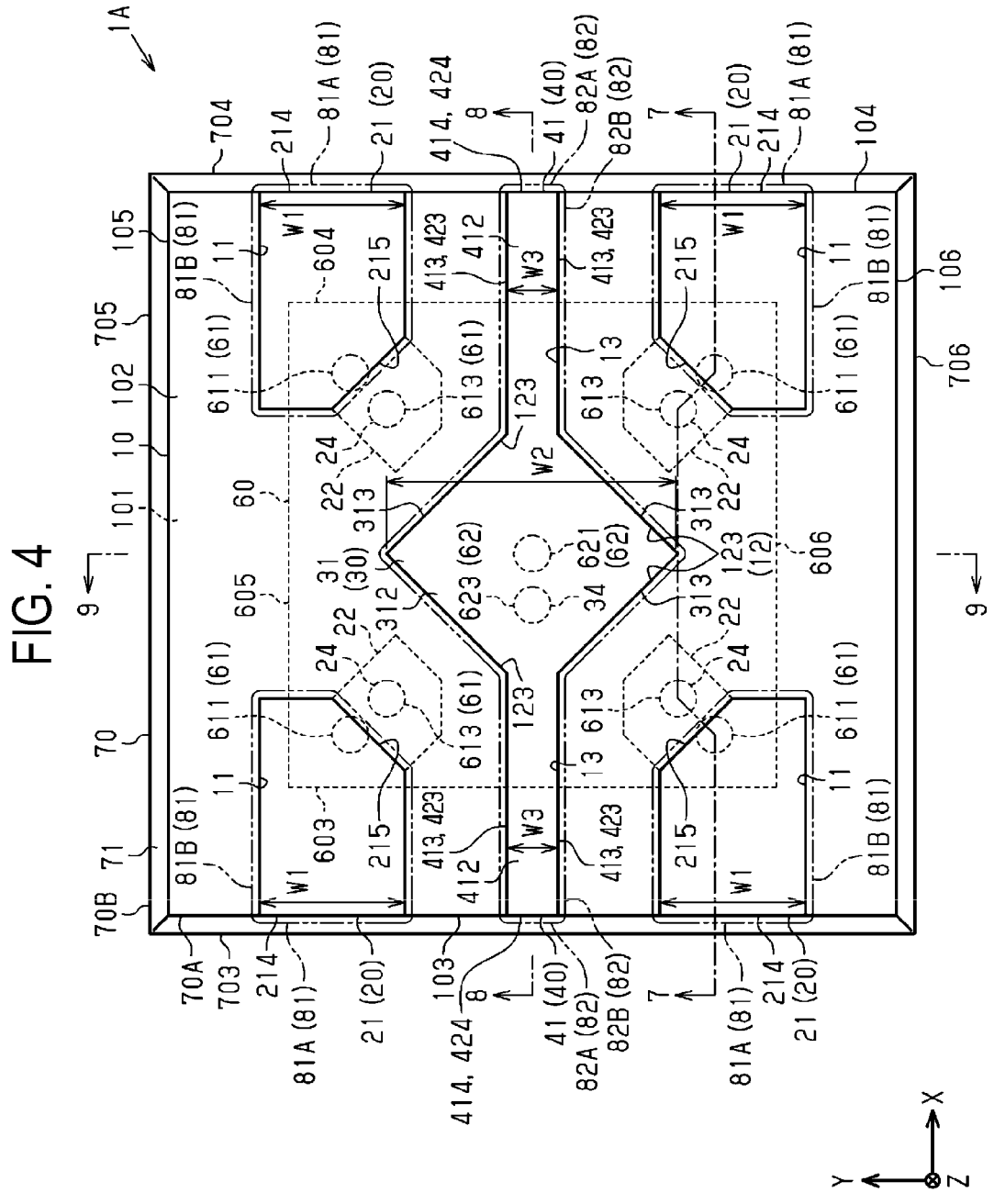
FIG. 4 is a schematic bottom view showing the semiconductor device of one embodiment.
Figure 5:
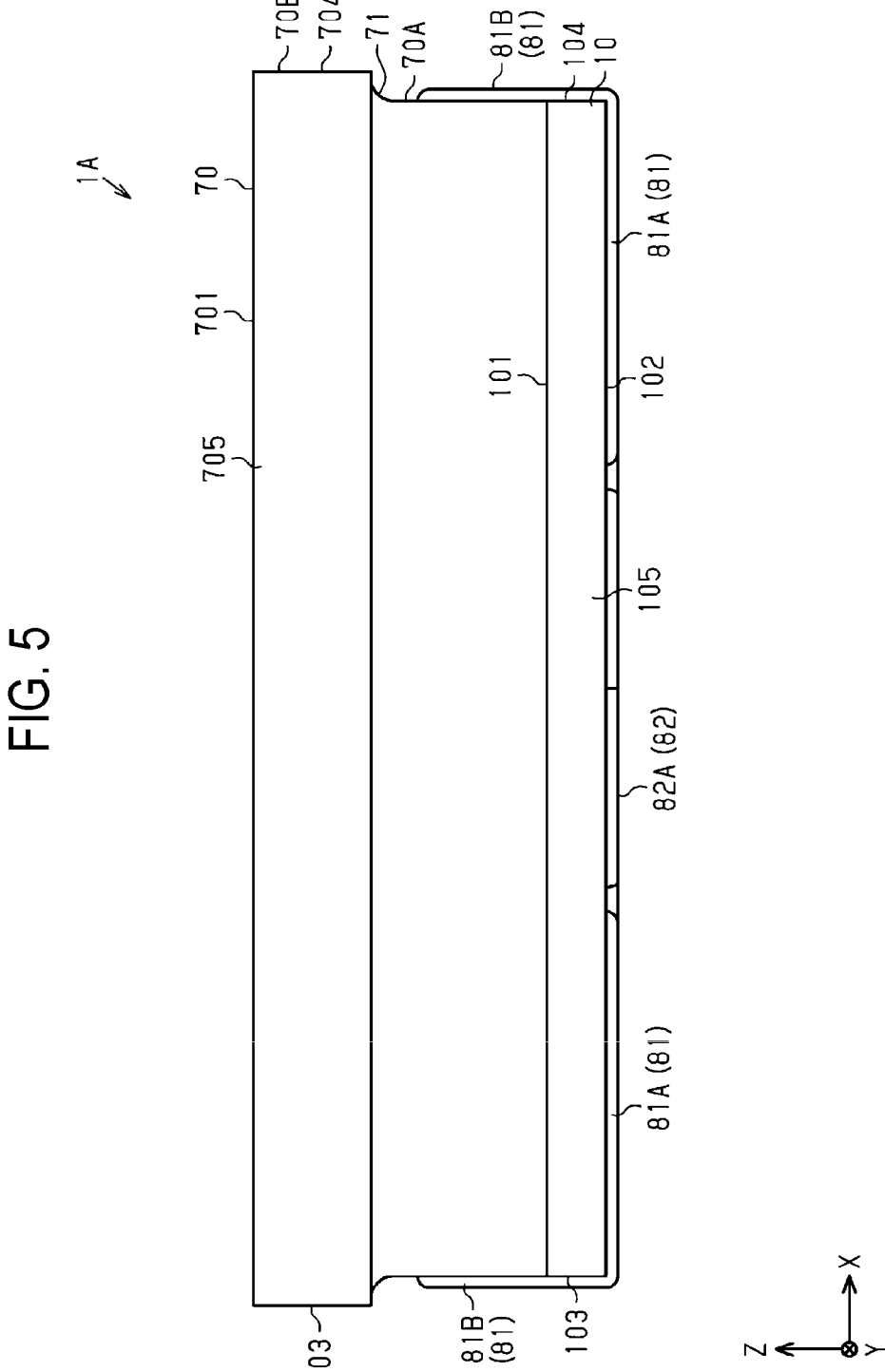
FIG. 5 is a schematic side view showing the semiconductor device of one embodiment.
Figure 6:
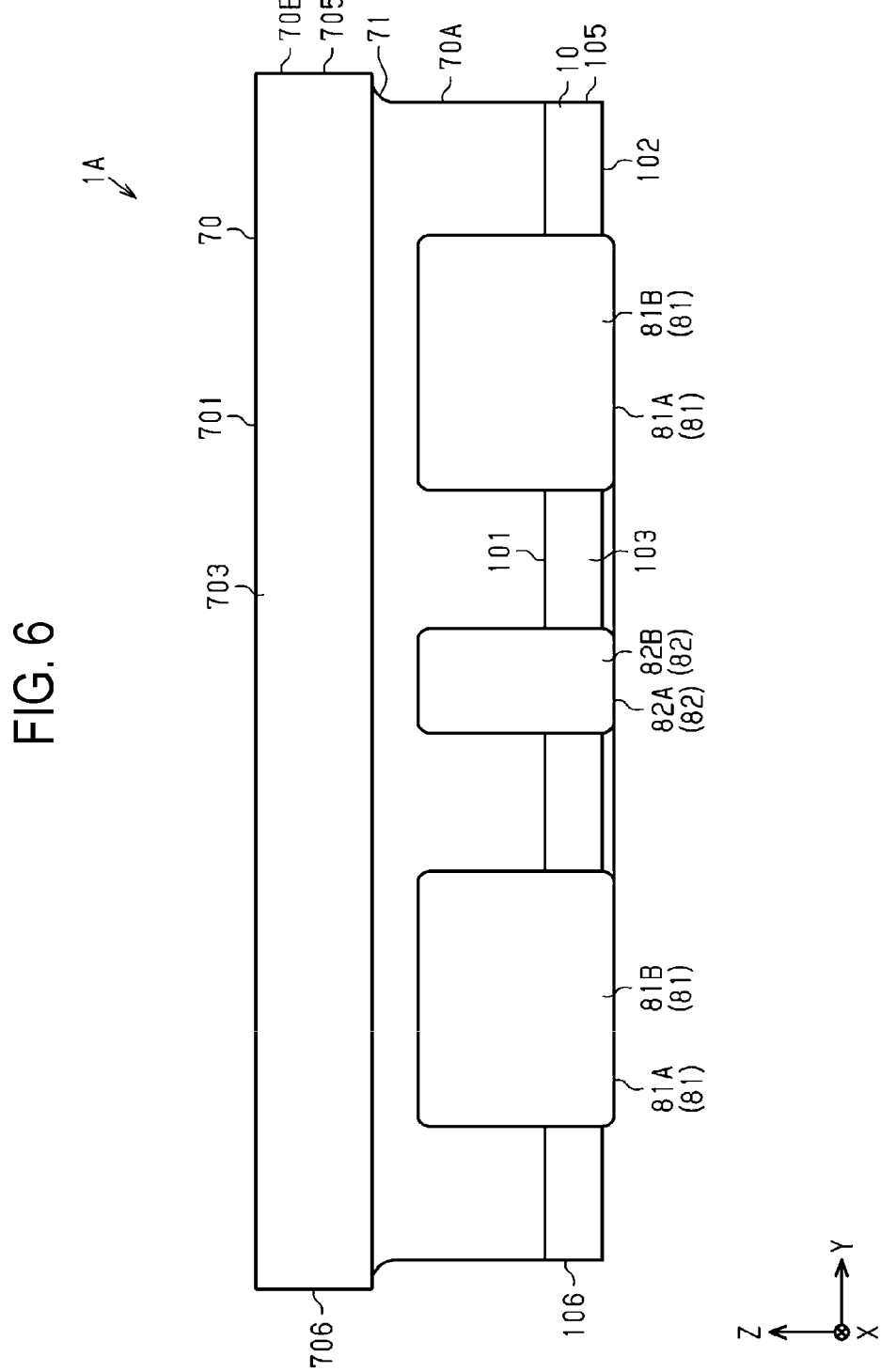
FIG. 6 is a schematic side view showing the semiconductor device of one embodiment.
Figure 7:
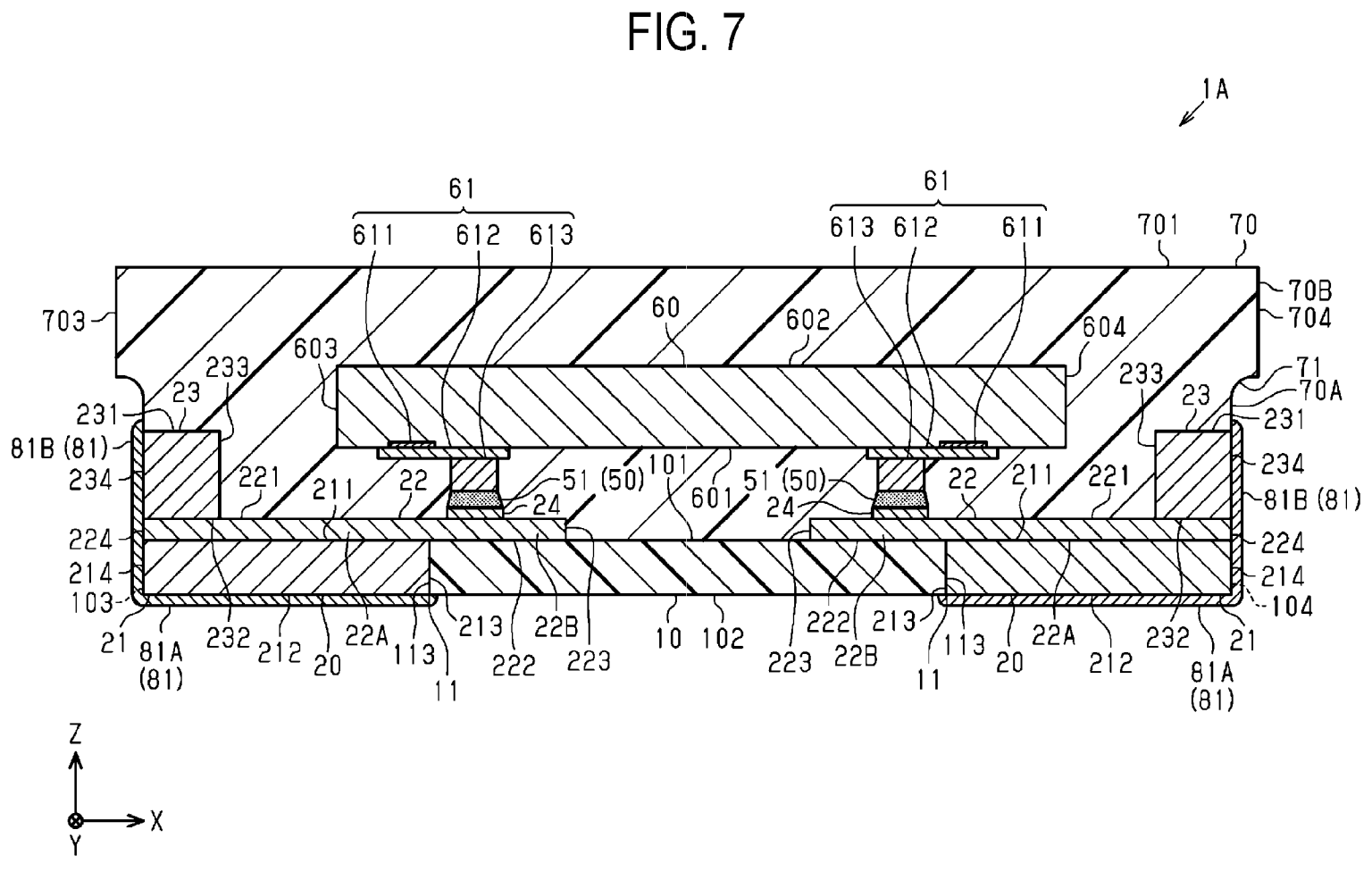
Figure 8:
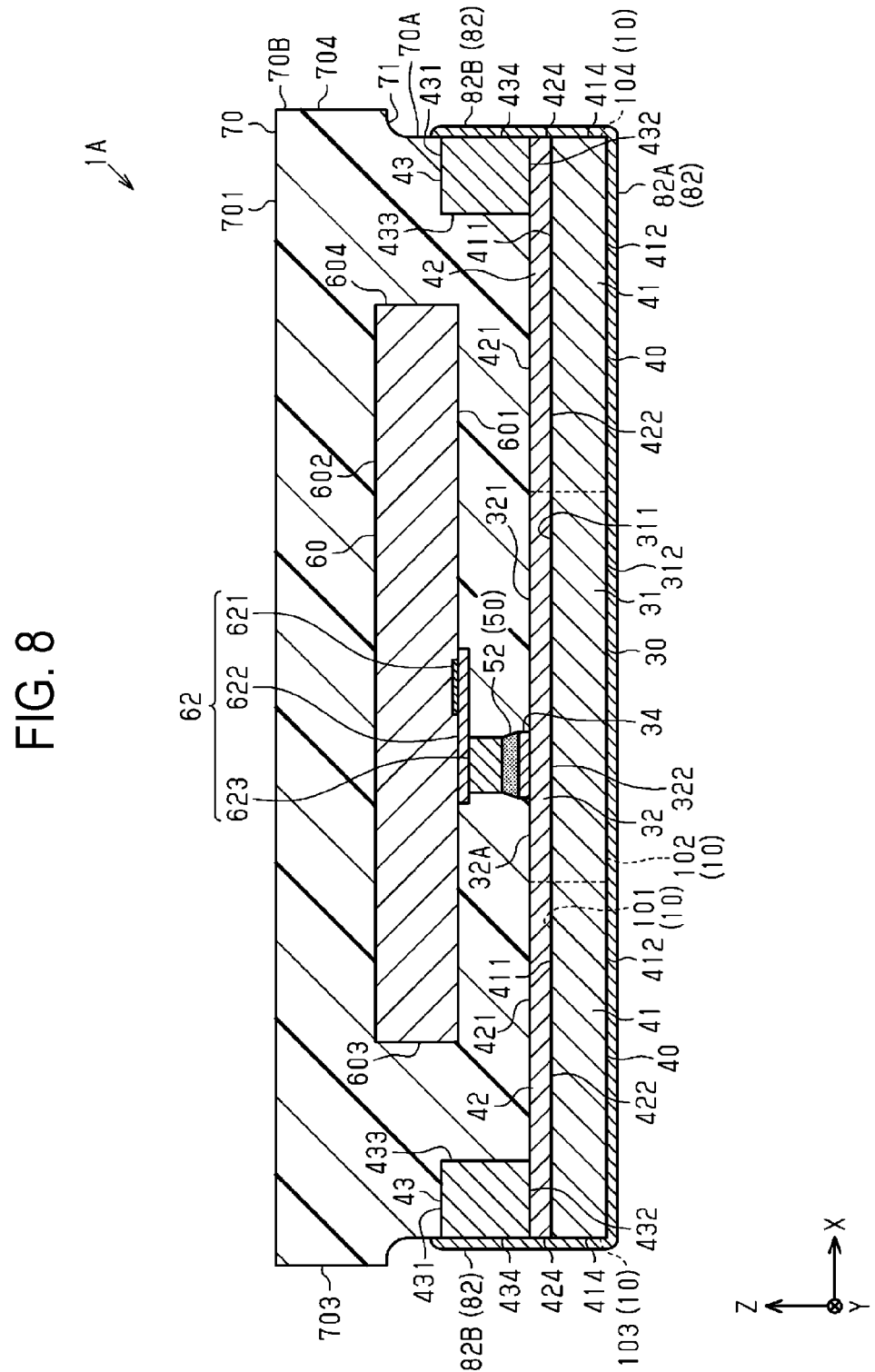
FIG. 8 is a cross-sectional view taken along line 8-8 in FIG. 4.
Figure 9:
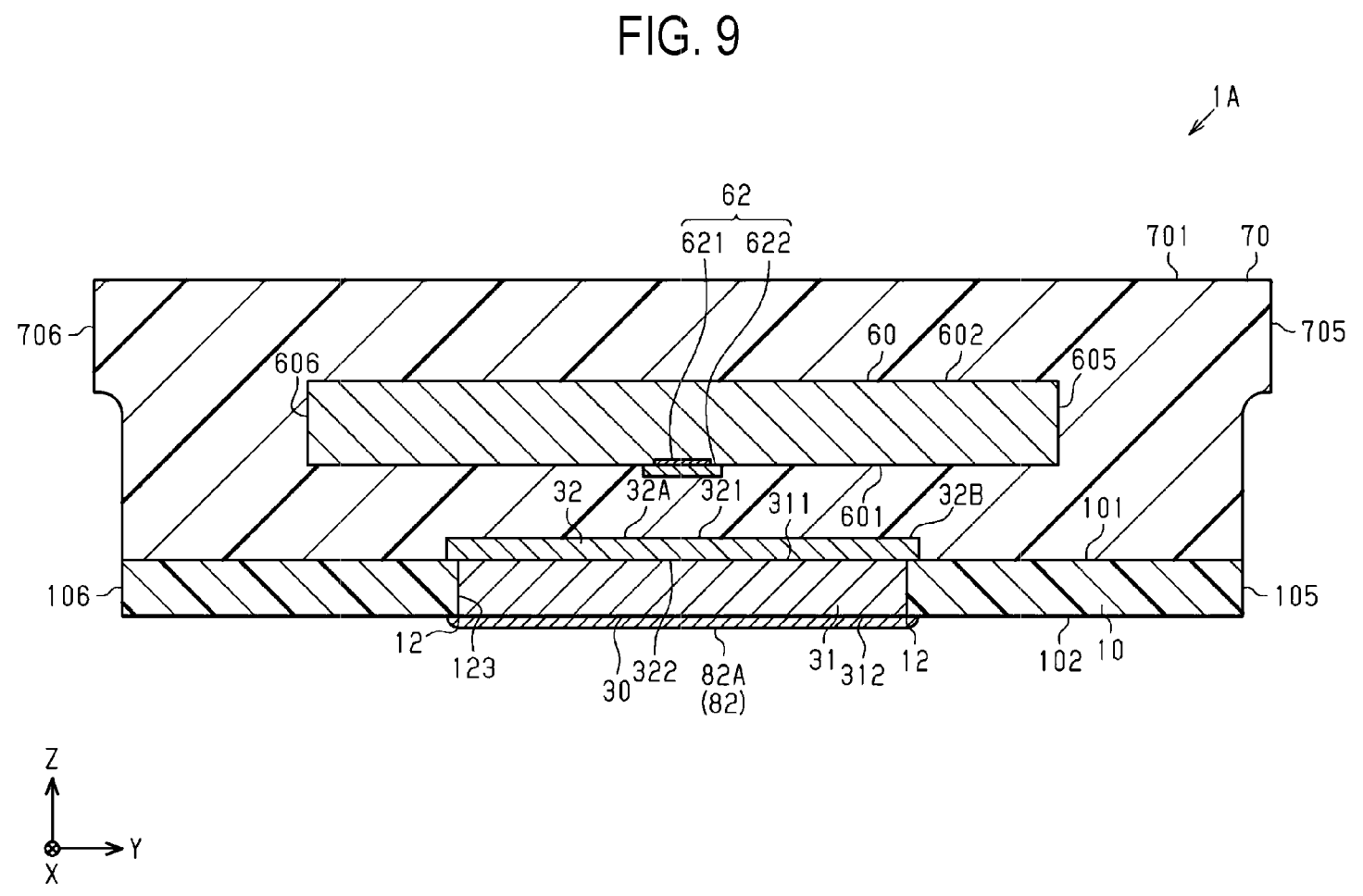

A semiconductor device 1A of one embodiment will be described with reference to FIGS. 1 to 9. FIGS. 1 and 2 are perspective views showing an appearance of the semiconductor device 1A. FIG. 1 is a perspective view of the semiconductor device 1A as viewed from an upper surface side, and FIG. 2 is a perspective view of the semiconductor device 1A as viewed from a lower surface side. FIG. 3 is a top view of the semiconductor device 1A. FIG. 4 is a bottom view of the semiconductor device 1A. FIG. 5 is a side view of the semiconductor device 1A, and FIG. 6 is a side view of the semiconductor device 1A viewed from a direction different from that of FIG. 5. FIG. 7 is a cross-sectional view taken along line 7-7 of FIG. 4. FIG. 8 is a cross-sectional view taken along line 8-8 of FIG. 4. FIG. 9 is a cross-sectional view taken along line 9-9 of FIG. 4.

The semiconductor device 1A shown in these figures is a device that is surface-mounted at a circuit board of various electronic apparatuses. Here, for convenience of explanation, a thickness direction of the semiconductor device 1A is referred to as a thickness direction Z. Further, a direction (horizontal direction in the top view) along one side of the semiconductor device 1A, which is orthogonal to the thickness direction Z, is referred to as a first direction X. Further, a direction (vertical direction in the top view) orthogonal to both the thickness direction Z and the first direction X of the semiconductor device 1A is referred to as a second direction Y.

Outline Configuration of Semiconductor Device

As shown in FIGS. 1 and 2, the semiconductor device 1A has a rectangular plate shape. The semiconductor device 1A includes a substrate 10, a sealing resin 70, a first external conductive film 81, and a second external conductive film 82. As shown in FIGS. 7 and 8, the semiconductor device 1A includes a terminal portion 20, a heat-dissipating conductive portion 30, a wiring portion 40, a bonding member 50, and a semiconductor element 60. The bonding member 50 includes a first bonding member 51 and a second bonding member 52. The semiconductor element 60 is connected to the terminal portion 20 by the first bonding member 51 and is connected to the heat-dissipating conductive portion 30 by the second bonding member 52.

Substrate

As shown in FIG. 7, the substrate 10 is a support member that serves as a base of the semiconductor element 60. The semiconductor element 60 is mounted on the substrate 10. As shown in FIGS. 3 and 4, a shape of the substrate 10 is a rectangular shape in which a length of a side in the first direction X is equal to a length of a side in the second direction Y when viewed from the thickness direction Z. The shape of the substrate 10 and the length of each side may be changed as appropriate.

As shown in FIGS. 1 to 9, the substrate 10 includes a substrate main surface 101, a substrate back surface 102, and substrate side surfaces 103 to 106. The substrate main surface 101 and the substrate back surface 102 face opposite to each other in the thickness direction Z. The substrate main surface 101 is flat. The substrate back surface 102 is flat. The substrate side surfaces 103 to 106 intersect (in the present embodiment, are orthogonal to) the substrate main surface 101 and the substrate back surface 102. The substrate side surfaces 103 and 104 face opposite to each other in the first direction X. The substrate side surfaces 105 and 106 face opposite to each other in the second direction Y. The substrate side surfaces 103 to 106 are flat.

The substrate 10 is made of, for example, a material having electrical insulation. As this material, for example, a synthetic resin containing an epoxy resin or the like as a main component can be used. The synthetic resin according to the present embodiment is an epoxy resin containing a filler. The filler is composed of, for example, $SiO_2$. The material constituting the substrate 10 is colored black, for example. Cutting marks are formed on the substrate main surface 101, which is a front surface of the substrate 10, the substrate back surface 102, and the substrate side surfaces 103 to 106. The filler contained in the material of the substrate 10 is exposed on the substrate main surface 101, which is the front surface of the substrate 10, the substrate back surface 102, and the substrate side surfaces 103 to 106.

As shown in FIG. 7, the substrate 10 includes a plurality of first through-holes 11 penetrating the substrate 10 from the substrate main surface 101 to the substrate back surface 102 in the thickness direction Z. As shown in FIG. 4, in the present embodiment, the substrate 10 includes two first through-holes 11 on each side of the first direction X. The side having the first through-holes 11 is a side extending in the second direction Y. Each first through-hole 11 extends to the substrate side surfaces 103 and 104. That is, each first through-hole 11 is opened on the substrate side surfaces 103 and 104.

As shown in FIGS. 4 and 9, the substrate 10 includes one second through-hole 12 penetrating the substrate 10 from the substrate main surface 101 to the substrate back surface 102 in the thickness direction Z. The second through-hole 12 is formed in a center of the substrate 10. Further, the second through-hole 12 is formed at a position overlapping with the semiconductor element 60 when viewed from the thickness direction Z. As shown in FIG. 4, the second through-hole 12 has, for example, a rectangular shape when viewed from the thickness direction Z. The substrate 10 includes inner side surfaces 123 forming the second through-hole 12. When viewed from the thickness direction Z, each inner side surface 123 is inclined with respect to each of the substrate side surfaces 103 to 106 of the substrate 10. The substrate side surfaces 103 to 106 face either the first direction X or the second direction Y. Therefore, each inner side surface 123 is inclined with respect to the first direction X. In the present embodiment, an inclination angle of the inner side surface 123 with respect to the substrate side surfaces 103 to 106 is 45 degrees.

As shown in FIG. 4, the substrate 10 includes a third through-hole 13 extending from the second through-hole 12 in the first direction X. The third through-hole 13 penetrates the substrate 10 from the substrate main surface 101 to the substrate back surface 102 in the thickness direction Z. In the present embodiment, the substrate 10 includes one third through-hole 13 on each side of the first direction X. The side on which the third through-hole 13 is formed is a side extending in the second direction Y. The third through-hole 13 extends from the second through-hole 12 to the substrate side surfaces 103 and 104. That is, the third through-hole 13 is opened on the substrate side surfaces 103 and 104. Further, as shown in FIG. 4, the third through-hole 13 is formed between two first through-holes 11 opened on the substrate side surfaces 103 and 104. The third through-hole 13 has, for example, a rectangular shape when viewed from the thickness direction Z.

Terminal Portion

As shown in FIGS. 3, 4, and 7, the semiconductor device 1A of the present embodiment includes a plurality of terminal portions 20. Each terminal portion 20 is formed to extend to the substrate side surfaces 103 and 104 of the substrate 10 from a portion overlapping with the semiconductor element 60 in the thickness direction Z.

As shown in FIG. 7, the terminal portion 20 includes a first through-electrode 21, a first main surface wiring 22, a columnar wiring 23, and a first wiring electrode 24. The first through-electrode 21 is arranged in the first through-hole 11. As shown in FIGS. 4 and 7, the first through-electrode 21 includes an upper surface 211, a lower surface 212, and side surfaces 213, 214, and 215. The upper surface 211 and the lower surface 212 face opposite to each other in the thickness direction Z. The side surfaces 213, 214, and 215 intersect the upper surface 211 and the lower surface 212.

The lower surface 212 of the first through-electrode 21 is flush with the substrate back surface 102 of the substrate 10. The lower surface 212 is an exposed surface exposed from the substrate back surface 102 of the substrate 10. The lower surface 212 of the first through-electrode 21 may not be flush with the substrate back surface 102 of the substrate 10. The side surface 213 of the first through-electrode 21 is in contact with an inner wall surface 113 of the first through-hole 11. The side surface 214 of the first through-electrode 21 is exposed from the substrate side surfaces 103 and 104 of the substrate 10. The first through-electrode 21 is formed of a shape in which a length of a side in the second direction Y is shorter than a length of a side in the first direction X that exposed from the substrate side surface 103, when viewed from the thickness direction Z.

As shown in FIG. 4, the side surface 215 of the first through-electrode 21 is inclined with respect to the first direction X. In the present embodiment, an inclination angle of the side surface 215 with respect to the first direction X is 45 degrees. The inclination angle of the side surface 215 can be changed as appropriate.

The first through-electrode 21 is made of a material having electrical conductivity. The first through-electrode 21 is formed of, for example, plated metal. As the material of the first through-electrode 21, for example, Cu (copper), a Cu alloy, or the like can be used.

As shown in FIG. 7, the first main surface wiring 22 extends from the upper surface 211 of the first through-electrode 21 to the substrate main surface 101 of the substrate 10. More specifically, the first main surface wiring 22 extends to the substrate main surface 101 overlapping with the semiconductor element 60 when viewed from the thickness direction Z. The first main surface wiring 22 includes a connection wiring 22A connected to the upper surface 211 of the first through-electrode 21, and a substrate-on-wiring 22B in contact with the substrate main surface 101 of the substrate 10.

The first main surface wiring 22 is made of a material having electrical conductivity and is electrically connected to the first through-electrode 21. The first main surface wiring 22 includes an upper surface 221, a lower surface 222, and side surfaces 223 and 224. The upper surface 221 and the lower surface 222 face opposite to each other in the thickness direction Z. The side surfaces 223 and 224 face a direction orthogonal to the thickness direction Z. The upper surface 221 of the first main surface wiring 22 faces the same direction as the substrate main surface 101 of the substrate 10. The lower surface 222 of the first main surface wiring 22 faces the same direction as the substrate back surface 102 of the substrate 10. A portion of the lower surface 222 is in contact with the substrate main surface 101 of the substrate 10, and the other portion of the lower surface 222 is connected to the upper surface 211 of the first through-electrode 21. A plurality of side surfaces 223 are in contact with the sealing resin 70. In FIG. 7, the side surface 224 facing the first direction X is an exposed side surface exposed from resin side surfaces 703 and 704 of the sealing resin 70. A thickness of the first main surface wiring 22 is, for example, 5 μm or more and 30 μm or less.

The first main surface wiring 22 includes, for example, a metal layer and a conductive layer. The metal layer and the conductive layer are laminated at the substrate main surface 101 of the substrate 10 in this order. The metal layer includes, for example, a first layer containing Ti (titanium) as a main component and in contact with the substrate main surface 101 of the substrate 10 and the upper surface 211 of the first through-electrode 21, and a second layer containing Cu as a main component and in contact with the first layer. The metal layer is formed as a seed layer that forms a conductive layer. The conductive layer contains, for example, Cu as a main component.

As shown in FIG. 7, the columnar wiring 23 extends in the thickness direction Z from the upper surface 221 of the first main surface wiring 22. More specifically, the columnar wiring 23 extends from the upper surface 221 of the first main surface wiring 22 to the side opposite to the first through-electrode 21 in the thickness direction Z. A shape of the columnar wiring 23 as viewed from the thickness direction Z is, for example, a rectangular shape. That is, the columnar wiring 23 of the present embodiment is a prism. The shape of the columnar wiring 23 is not limited thereto and may be a cylinder, a polygonal column, or the like.

The columnar wiring 23 includes an upper surface 231, a lower surface 232, and side surfaces 233 and 234. The upper surface 231 and the lower surface 232 face opposite to each other in the thickness direction Z. The side surfaces 233 and 234 face a direction orthogonal to the thickness direction Z. In the present embodiment, the upper surface 231 of the columnar wiring 23 is, for example, flat. A shape of the upper surface 231 can be arbitrarily changed. The lower surface 232 of the columnar wiring 23 is a surface in contact with the upper surface 221 of the first main surface wiring 22. The lower surface 232 is, for example, flat. In the present embodiment, a plurality of side surfaces 233 are in contact with the sealing resin 70. In FIG. 7, the side surface 234 facing the first direction X is an exposed side surface exposed from the sealing resin 70.

In the thickness direction Z, the terminal portion 20 includes the first through-electrode 21, the first main surface wiring 22, and the columnar wiring 23. A height of the terminal portion 20 in the thickness direction Z is defined by a length from the lower surface 212 of the first through-electrode 21 to the upper surface 231 of the columnar wiring 23. The height of the terminal portion 20 is, for example, 100 μm or more and 200 μm or less.

As shown in FIG. 7, the first wiring electrode 24 is formed on the upper surface 221 of the first main surface wiring 22. The first main surface wiring 22 includes the connection wiring 22A connected to the first through-electrode 21, and the substrate-on-wiring 22B in contact with the substrate main surface 101. The first wiring electrode 24 is formed on the upper surface 221 of the substrate-on-wiring 22B. The first wiring electrode 24 is formed in a region overlapping with the semiconductor element 60 in the thickness direction Z. Further, the first wiring electrode 24 is formed in a portion of the first main surface wiring 22 that overlaps with the substrate main surface 101 of the substrate 10 in the thickness direction Z. The first wiring electrode 24 is formed, for example, in a circular shape when viewed from the thickness direction Z. A shape of the first wiring electrode 24 as viewed from the thickness direction Z can be appropriately changed to be rectangular, polygonal, or the like. The first wiring electrode 24 is made of, for example, Ni (nickel).

Heat-Dissipating Conductive Portion

As shown in FIGS. 4 and 8, the semiconductor device 1A of the present embodiment includes the heat-dissipating conductive portion 30. The heat-dissipating conductive portion 30 of the present embodiment is arranged to overlap with the semiconductor element 60 in the thickness direction Z.

The heat-dissipating conductive portion 30 is arranged in the second through-hole 12 that overlaps with the semiconductor element 60 when viewed from the thickness direction Z. That is, the heat-dissipating conductive portion 30 penetrates the substrate 10. The heat-dissipating conductive portion 30 is used, for example, for heat dissipation of the semiconductor element 60. The heat-dissipating conductive portion 30 releases heat, which is generated from the semiconductor element 60, to the substrate back surface 102 side of the substrate 10.

As shown in FIG. 4, the heat-dissipating conductive portion 30 is arranged to overlap with a central portion of the semiconductor element 60. The substrate 10 includes the second through-hole 12 that overlaps with the central portion of the semiconductor element 60. An arrangement position of the heat-dissipating conductive portion 30 can be changed as appropriate. For example, it is preferable to arrange the second through-hole 12 and the heat-dissipating conductive portion 30 so that the second through-hole 12, that is, the heat-dissipating conductive portion 30, overlaps with a region including the hottest portion in the semiconductor element 60. For example, in the semiconductor element 60, the amount of generated heat is large in a portion where a power transistor is formed. In this way, it is preferable to arrange the second through-hole 12 and the heat-dissipating conductive portion 30 to overlap with a region including an element portion having the large amount of generated heat in the semiconductor element 60.

As shown in FIGS. 8 and 9, the heat-dissipating conductive portion 30 includes a second through-electrode 31, a second main surface wiring 32, and a second wiring electrode 34. The second through-electrode 31 is arranged in the second through-hole 12. The second through-electrode 31 includes an upper surface 311, a lower surface 312, and a plurality of side surfaces 313. The upper surface 311 and the lower surface 312 face opposite to each other in the thickness direction Z. Each side surface 313 faces a direction intersecting the thickness direction Z and intersects the upper surface 311 and the lower surface 312.

As shown in FIG. 4, the side surface 313 of the second through-electrode 31 as viewed from the thickness direction Z is inclined with respect to both the first direction X and the second direction Y. In the semiconductor device 1A of the present embodiment, an inclination angle of each side surface 313 with respect to both the first direction X and the second direction Y is 45 degrees. The inclination angle of each side surface 313 can be changed as appropriate. Further, the side surfaces 313 can have different inclination angles. The side surface 313 of the second through-electrode 31 faces the side surface 215 of the terminal portion 20. In the present embodiment, the side surface 313 of the second through-electrode 31 is parallel to the side surface 215 of the terminal portion 20.

As shown in FIG. 9, the lower surface 312 of the second through-electrode 31 is flush with the substrate back surface 102 of the substrate 10. The lower surface 312 is an exposed surface exposed from the substrate back surface 102 of the substrate 10. The lower surface 312 of the second through-electrode 31 may not be flush with the substrate back surface 102 of the substrate 10. Further, the side surface 313 of the second through-electrode 31 is in contact with the inner side surface 123 of the second through-hole 12. The second through-electrode 31 is made of a material having electrical conductivity. The second through-electrode 31 is formed of, for example, plated metal. The second through-electrode 31 is made of, for example, the same material as the first through-electrode 21. As the material of the second through-electrode 31, for example, Cu, a Cu alloy, or the like can be used.

The second main surface wiring 32 is connected to the upper surface 311 of the second through-electrode 31. The second main surface wiring 32 has a rectangular shape when viewed from the thickness direction Z. The second main surface wiring 32 includes an upper surface 321 and a lower surface 322. The upper surface 321 and the lower surface 322 face opposite to each other in the thickness direction Z. The upper surface 321 of the second main surface wiring 32 faces in the same direction as the upper surface 311 of the second through-electrode 31. The lower surface 322 of the second main surface wiring 32 faces the upper surface 311 of the second through-electrode 31 and is in contact with the upper surface 311.

A thickness of the second main surface wiring 32 is the same as the thickness of the first main surface wiring 22. As shown in FIG. 9, the second main surface wiring 32 is formed to be larger than the second through-electrode 31 when viewed from the thickness direction Z. The second main surface wiring 32 includes a connection wiring 32A connected to the upper surface 311 of the second through-electrode 31, and an extension portion 32B extending outward from the side surface 313 of the second through-electrode 31. The extension portion 32B is a portion that does not overlap with the second through-electrode 31 in the thickness direction Z. In the present embodiment, the extension portion 32B is annular. The lower surface 322 of the extension portion 32B is in contact with the substrate main surface 101.

For example, the second main surface wiring 32 includes a metal layer and a conductive layer. The metal layer and the conductive layer are laminated at the upper surface 311 of the second through-electrode 31 in this order. The metal layer includes a first layer in contact with the upper surface 311 of the second through-electrode 31, and a second layer in contact with the first layer. The first layer is, for example, a layer containing Ti as a main component, and the second layer is, for example, a layer containing Cu as a main component. The metal layer is formed as a seed layer that forms a conductive layer. The conductive layer contains, for example, Cu as a main component. The configuration of the second main surface wiring 32 is the same as the configuration of the first main surface wiring 22. The second main surface wiring 32 is formed at the same time as the first main surface wiring 22.

As shown in FIG. 8, the second wiring electrode 34 is formed on the upper surface 321 of the second main surface wiring 32. The semiconductor device 1A of the present embodiment includes one second wiring electrode 34. The number of second wiring electrodes 34 may be two or more. The second wiring electrode 34 is formed in a region overlapping with the semiconductor element 60 in the thickness direction Z. The second wiring electrode 34 is formed on the upper surface 321 of the second main surface wiring 32 that overlaps with the second through-electrode 31 in the thickness direction Z. That is, the second wiring electrode 34 is formed on the upper surface 321 of the connection wiring 32A, which is connected to the upper surface 311 of the second through-electrode 31, in the second main surface wiring 32. The second wiring electrode 34 is formed in, for example, a circular shape when viewed from the thickness direction Z. A shape of the second wiring electrode 34 as viewed from the thickness direction Z can be appropriately changed to be rectangular, polygonal, or the like. For example, the second wiring electrode 34 is formed in the same process as the first wiring electrode 24 shown in FIG. 7. The second wiring electrode 34 is made of, for example, Ni.

Wiring Portion

As shown in FIGS. 3, 4, and 8, the semiconductor device 1A of the present embodiment includes two wiring portions 40.

As shown in FIG. 4, the wiring portions 40 extend from the heat-dissipating conductive portion 30 toward the substrate side surfaces 103 and 104, respectively. The wiring portions 40 are electrically connected to the heat-dissipating conductive portion 30. As shown in FIG. 8, the wiring portions 40 are formed to be exposed from the substrate back surface 102 and the substrate side surfaces 103 and 104 of the substrate 10.

Each wiring portion 40 includes a third through-electrode 41, a third main surface wiring 42, and a columnar wiring 43. The third through-electrode 41 is arranged in the third through-hole 13. In the present embodiment, the third through-electrode 41 extends from the second through-electrode 31 of the heat-dissipating conductive portion 30 to the substrate side surfaces 103 and 104 of the substrate 10.

The third through-electrode 41 includes an upper surface 411, a lower surface 412, and side surfaces 413 and 414. The upper surface 411 and the lower surface 412 face opposite to each other in the thickness direction Z. The side surfaces 413 and 414 intersect the upper surface 411 and the lower surface 412.

The lower surface 412 of the third through-electrode 41 is flush with the substrate back surface 102 of the substrate 10. The lower surface 412 is an exposed surface exposed from the substrate back surface 102 of the substrate 10. The lower surface 412 of the third through-electrode 41 may not be flush with the substrate back surface 102 of the substrate 10. A first end portion of the third through-electrode 41 inside the semiconductor device 1A is electrically connected to the second through-electrode 31. A second end portion of the third through-electrode 41 outside the semiconductor device 1A is exposed from the substrate side surfaces 103 and 104 of the substrate 10. That is, the side surface 414 of the third through-electrode 41 is exposed from the substrate side surfaces 103 and 104 of the substrate 10.

The third through-electrode 41 is made of a material having electrical conductivity. The third through-electrode 41 is formed of, for example, plated metal. The third through-electrode 41 is made of, for example, the same material as the first through-electrode 21 and the second through-electrode 31. As the material of the third through-electrode 41, for example, Cu, a Cu alloy, or the like can be used.

The third main surface wiring 42 is formed on the upper surface 411 of the third through-electrode 41. The third main surface wiring 42 extends from the third main surface wiring 42 of the heat-dissipating conductive portion 30 to the substrate side surfaces 103 and 104 of the substrate 10.

The third main surface wiring 42 is made of a material having electrical conductivity and is electrically connected to the third through-electrode 41. The third main surface wiring 42 includes an upper surface 421, a lower surface 422, and side surfaces 423 and 424. The upper surface 421 and the lower surface 422 face opposite to each other in the thickness direction Z. The side surfaces 423 and 424 face a direction orthogonal to the thickness direction Z. The upper surface 421 of the third main surface wiring 42 faces the same direction as the substrate main surface 101 of the substrate 10. The lower surface 422 of the third main surface wiring 42 faces the same direction as the substrate back surface 102 of the substrate 10. In FIG. 8, the side surface 424 facing the first direction X is an exposed side surface exposed from the resin side surfaces 703 and 704 of the sealing resin 70. A thickness of the third main surface wiring 42 is, for example, 5 μm or more and 30 μm or less.

The third main surface wiring 42 includes, for example, a metal layer and a conductive layer. The metal layer and the conductive layer are laminated at the upper surface 411 of the third through-electrode 41 in this order. The metal layer includes, for example, a first layer containing Ti as a main component and in contact with the upper surface 411 of the third through-electrode 41, and a second layer containing Cu as a main component and in contact with the first layer. The metal layer is formed as a seed layer that forms a conductive layer. The conductive layer contains, for example, Cu as a main component.

As shown in FIG. 8, the columnar wiring 43 extends in the thickness direction Z from the upper surface 421 of the third main surface wiring 42. More specifically, the columnar wiring 43 extends from the upper surface 421 of the third main surface wiring 42 to the side opposite to the third through-electrode 41 in the thickness direction Z. A shape of the columnar wiring 43 as viewed from the thickness direction Z is, for example, a rectangular shape. That is, the columnar wiring 43 of the present embodiment is a prism. The shape of the columnar wiring 43 is not limited thereto and may be a cylinder, a polygonal column, or the like.

The columnar wiring 43 includes an upper surface 431, a lower surface 432, and side surfaces 433 and 434. The upper surface 431 and the lower surface 432 face opposite to each other in the thickness direction Z. The side surfaces 433 and 434 face a direction orthogonal to the thickness direction Z. In the present embodiment, the upper surface 431 of the columnar wiring 43 is, for example, flat. A shape of the upper surface 431 can be arbitrarily changed. The lower surface 432 of the columnar wiring 43 is a surface in contact with the upper surface 421 of the third main surface wiring 42. The lower surface 432 is, for example, flat. In this embodiment, a plurality of side surfaces 433 are in contact with the sealing resin 70. In FIG. 8, the side surface 434 facing the first direction X is an exposed side surface exposed from the sealing resin 70.

In the thickness direction Z, the wiring portion 40 includes the third through-electrode 41, the third main surface wiring 42, and the columnar wiring 43. A height of the wiring portion 40 in the thickness direction Z is defined by a length from the lower surface 412 of the third through-electrode 41 to the upper surface 431 of the columnar wiring 43. The height of the wiring portion 40 is, for example, 100 μtm or more and 200 μm or less. In the present embodiment, the height of the wiring portion 40 is equal to the height of the terminal portion 20. In the present embodiment, a structure with the height of the wiring portion 40 being equal to the height of the terminal portion 20 is intended to mean a structure with the height of the wiring portion 40 being substantially equal to the height of the terminal portion 20, including errors in measurement and manufacture. The height of the wiring portion 40 may be different from the height of the terminal portion 20.

As shown in FIG. 4, a width W2 of the second through-electrode 31 is wider than a width W1 of the terminal portion 20. In this embodiment, the width W2 of the second through-electrode 31 is, for example, a length of a portion which has maximum length of the second through-electrode 31 in the second direction Y orthogonal to the first direction X to which the third through-electrode 41 extends, when viewed in the thickness direction Z. The width W1 of the terminal portion 20, similarly to the second through-electrode 31, is a width of the first through-electrode 21, which is a member exposed from the substrate back surface 102 of the substrate 10. The width of the first through-electrode 21 is a width in the second direction Y orthogonal to the first direction X to which the first through-electrode 21 extends, when viewed in the thickness direction Z. The semiconductor device 1A of the present embodiment includes four terminal portions 20 (the first through-electrodes 21). The widths W1 of the first through-electrodes 21 are the same. Further, in this embodiment, the width W1 of the first through-electrode 21 of the terminal portion 20 is wider than a width W3 of the third through-electrode 41.

The width W2 of the second through-electrode 31 is wider than the width W3 of the third through-electrode 41. The width W3 of the third through-electrode 41 is a width of the third through-electrode 41 in the second direction Y orthogonal to the first direction X to which the third through-electrode 41 extends, when viewed from the thickness direction Z. In this embodiment, the width W3 of the third through-electrode 41 extending toward the substrate side surface 103 from the second through-electrode 31 and the width W3 of the third through-electrode 41 extending toward the substrate side surface 104 from the second through-electrode 31 are the same. In this embodiment, the width W3 of the third through-electrode 41 is narrower than the width W2 of the terminal portion 20.

Semiconductor Element

As shown in FIGS. 3 and 4, the semiconductor element 60 includes a rectangular shape when viewed from the thickness direction Z. As shown in FIGS. 3, 4, 7, and 8, the semiconductor element 60 includes an element main surface 601 and an element back surface 602 facing opposite to each other in the thickness direction Z, and a plurality of element side surfaces 603 to 606 facing a direction orthogonal to the thickness direction Z. The element side surfaces 603 to 606 intersect the element main surface 601 and the element back surface 602. The element main surface 601 faces the substrate main surface 101 of the substrate 10. The element back surface 602 faces the same direction as the substrate main surface 101 of the substrate 10.

The semiconductor element 60 is, for example, an integrated circuit (IC) such as an LSI (Large Scale Integration). Further, the semiconductor element 60 may be a voltage-controlled element such as an LDO (Low Drop Out), an amplification element such as an operational amplifier, or a discrete semiconductor element such as a diode or various sensors. For example, in a case of an LSI, the element main surface 601 is a surface on which a constituent member for a function of the semiconductor element 60 is formed. The semiconductor element 60 is not limited to an element in which a plurality of constituent members are formed, but may be an element in which a single constituent member is formed, such as a chip capacitor or a chip inductor, or an element in which a constituent member is formed on a base material other than a semiconductor. In the present embodiment, the semiconductor element 60 is an LSI.

As shown in FIG. 4, the semiconductor element 60 includes a first connection pad 61 and a second connection pad 62 for mounting at the element main surface 601 side. The first connection pad 61 is arranged at a corner of the semiconductor element 60. The second connection pad 62 is arranged inside a plurality of first connection pads 61. In the present embodiment, the second connection pad 62 is arranged in a center of the semiconductor element 60. The plurality of first connection pads 61 are terminals for inputting/outputting signals and the like related to an operation of the semiconductor element 60. The second connection pad 62 is, for example, a terminal that does not affect electrical characteristics of the semiconductor element 60. This terminal is, for example, a ground terminal. The second connection pad 62 may be a pad insulated from the first connection pad 61, or the like.

As shown in FIGS. 7 and 8, the semiconductor element 60 is arranged such that the element main surface 601 faces the substrate main surface 101 of the substrate 10. As shown in FIG. 7, the first connection pad 61 of the semiconductor element 60 is arranged to face the first wiring electrode 24 on the upper surface 221 of the first main surface wiring 22. The first connection pad 61 is connected to the first wiring electrode 24 by the first bonding member 51. As shown in FIG. 8, the second connection pad 62 of the semiconductor element 60 is arranged to face the second wiring electrode 34 on the upper surface 321 of the second main surface wiring 32. The second connection pad 62 is connected to the second wiring electrode 34 by the second bonding member 52. In this way, the semiconductor element 60 is flip-chip mounted with the element main surface 601 facing the substrate main surface 101 of the substrate 10. Therefore, it can be said that the element main surface 601 is an element mounting surface for mounting the semiconductor element 60.

As shown in FIG. 7, the first connection pad 61 includes a first electrode pad 611, a first rewiring layer 612, and a first element electrode 613. The first rewiring layer 612 corresponds to an element wiring portion. The first electrode pad 611 is exposed from an opening of an insulating layer covering the element main surface 601 of the semiconductor element 60. The first electrode pad 611 is made of, for example, Al (aluminum). The insulating layer is made of, for example, SiN (silicon nitride). The first rewiring layer 612 covers a surface of the first electrode pad 611 and extends to the insulating layer. The first rewiring layer 612 is made of, for example, Cu, a Cu alloy, or the like. The first rewiring layer 612 is covered with a protective film (not shown). The protective film includes an opening that exposes a portion of the first rewiring layer 612 as a connection terminal. The first element electrode 613 is connected to the first rewiring layer 612 exposed from the protective film. The first rewiring layer 612 is an example of the element wiring portion. The first element electrode 613 includes, for example, a conductive layer and a barrier layer. The conductive layer is composed of, for example, Cu or a Cu alloy. The conductive layer may include a seed layer. The seed layer is composed of, for example, Ti/Cu. The barrier layer is composed of Ni, an alloy containing Ni, or a plurality of metal layers containing Ni. As the barrier layer, for example, Ni, Pd (palladium), Au (gold), an alloy containing two or more of these metals, and the like can be used. The protective film is made of, for example, a polyimide resin. The first electrode pad 611 and the first element electrode 613 do not overlap with each other in the thickness direction Z. That is, the first electrode pad 611 and the first element electrode 613 are displaced in a direction intersecting the thickness direction Z.

As shown in FIG. 8, the second connection pad 62 is configured in the same manner as the first connection pad 61. More specifically, the second connection pad 62 includes a second electrode pad 621, a second rewiring layer 622, and a second element electrode 623. The second rewiring layer 622 corresponds to the element wiring portion. The second electrode pad 621 is exposed from an opening of the insulating layer covering the element main surface 601 of the semiconductor element 60. The second electrode pad

621 is made of, for example, Al. The insulating layer is made of, for example, SiN. The second rewiring layer 622 covers the surface of the second electrode pad 621 and extends to the insulating layer. The second rewiring layer 622 is made of, for example, Cu, a Cu alloy, or the like. The second rewiring layer 622 is covered with a protective film (not shown). The protective film includes an opening that exposes a portion of the second rewiring layer 622 as a connection terminal. The second element electrode 623 is connected to the second rewiring layer 622 exposed from the protective film. The second rewiring layer 622 is an example of the element wiring portion. The second element electrode 623 includes, for example, a conductive layer and a barrier layer. The conductive layer is composed of, for example, Cu or a Cu alloy. The conductive layer may include a seed layer. The seed layer is composed of, for example, Ti/Cu. The barrier layer is composed of Ni, an alloy containing Ni, or a plurality of metal layers containing Ni. As the barrier layer, for example, Ni, Pd, Au, an alloy containing two or more of these metals, and the like can be used. The second electrode pad 621 and the second element electrode 623 do not overlap with each other in the thickness direction Z. That is, the second electrode pad 621 and the second element electrode 623 are displaced in a direction intersecting the thickness direction Z.

As shown in FIG. 4, the first electrode pad 611 and the first element electrode 613 are formed in, for example, a circular shape when viewed from the thickness direction Z. The second electrode pad 621 and the second element electrode 623 are formed in, for example, a circular shape when viewed from the thickness direction Z. In FIG. 4, the first element electrode 613 and the first wiring electrode 24 are overlapped and shown in the same size. Further, in FIG. 4, the second element electrode 623 and the second wiring electrode 34 are overlapped and shown in the same size.

As shown in FIG. 7, the first bonding member 51 bonds the semiconductor element 60 to the terminal portion 20. The first bonding member 51 bonds the first wiring electrode 24 of the terminal portion 20 and the first element electrode 613 of the semiconductor element 60. The first bonding member 51 is formed in substantially a trapezoidal shape in a section along the thickness direction Z, that is, a section perpendicular to the substrate main surface 101. The first bonding member 51 is made of Sn (tin) or an alloy containing Sn. This alloy is, for example, a Sn—Ag (silver)-based alloy, a Sn—Sb (antimony)-based alloy, or the like.

As shown in FIG. 8, the second bonding member 52 bonds the semiconductor element 60 to the heat-dissipating conductive portion 30. The second bonding member 52 bonds the second wiring electrode 34 of the heat-dissipating conductive portion 30 and the second element electrode 623 of the semiconductor element 60. The second bonding member 52 is formed in substantially a rectangular shape (parallel quadrilateral shape) in a section perpendicular to the substrate main surface 101. The second bonding member 52 is made of Sn or an alloy containing Sn. This alloy is, for example, a Sn—Ag-based alloy, a Sn—Sb-based alloy, or the like.

Sealing Resin

As shown in FIGS. 7 and 8, the sealing resin 70 is formed to be in contact with the substrate main surface 101 of the substrate 10 and to cover the semiconductor element 60. As shown in FIG. 7, the sealing resin 70 is filled between the substrate 10 and the semiconductor element 60. The sealing resin 70 covers the semiconductor element 60 and the terminal portion 20. As shown in FIG. 8, the sealing resin 70 is filled between the heat-dissipating conductive portion 30 and the semiconductor element 60. As a result, the sealing resin 70 covers the substrate main surface 101 of the substrate 10, the wiring portion 40, and the heat-dissipating conductive portion 30. Further, the sealing resin 70 covers the element main surface 601 of the semiconductor element 60, the element side surfaces 603 to 606 (see FIG. 3), and the element back surface 602. Further, the sealing resin 70 covers the first bonding member 51 that bonds the semiconductor element 60 and the terminal portion 20, and the second bonding member 52 that bonds the semiconductor element 60 and the heat-dissipating conductive portion 30.

The sealing resin 70 overlaps with the substrate 10 when viewed from the thickness direction Z. The sealing resin 70 includes a resin upper surface 701 facing the same direction as the substrate main surface 101 of the substrate 10, and resin side surfaces 703 to 706 (see FIGS. 3 and 4) facing the same direction as the substrate side surfaces 103 to 106. The resin upper surface 701 of the sealing resin 70 constitutes the upper surface of the semiconductor device 1A. The substrate back surface 102 of the substrate 10 constitutes the lower surface of the semiconductor device 1A. The resin side surfaces 703 to 706 and the substrate side surfaces 103 to 106 constitute the side surfaces of the semiconductor device 1A.

As shown in FIGS. 1 to 6, the sealing resin 70 includes a first resin portion 70A which is a portion on a side of the substrate 10 in the thickness direction Z, and a second resin portion 70B on a side of the resin upper surface 701. The first resin portion 70A has the same size as the substrate 10 when viewed from the thickness direction Z. Further, when viewed from the thickness direction Z, the second resin portion 70B is formed to be larger than the first resin portion 70A. In this way, the sealing resin 70 includes a step 71 recessed inside the sealing resin 70 due to a difference in size between the first resin portion 70A and the second resin portion 70B. As shown in FIGS. 3 and 4, the step 71 is provided over an entire circumferential direction of the sealing resin 70.

The sealing resin 70 is made of, for example, a resin having electrical insulation. As this resin, for example, a synthetic resin containing an epoxy resin as a main component can be used. That is, a resin constituting the substrate 10 may contain the same material as that of the sealing resin 70. Further, the sealing resin 70 is colored black, for example. A material and shape of the sealing resin 70 are not limited. That is, the resin constituting the substrate 10 may be made of a material different from that of the sealing resin 70.

External Conductive Film

As shown in FIG. 7, the first external conductive film 81 includes a first conductive film 81A and a second conductive film 81B. The first conductive film 81A covers the lower surface 212 of the first through-electrode 21. The second conductive film 81B covers the side surface 214 of the first through-electrode 21, the side surface 224 of the first main surface wiring 22, and the side surface 234 of the columnar wiring 23. The first external conductive film 81 including the first conductive film 81A and the second conductive film 81B serves as an external connection terminal of the semiconductor device 1A. The first external conductive film 81 is composed of, for example, a plurality of metal layers laminated with each other. Examples of the metal layer may include a Ni layer and an Au layer. A material of the first external conductive film 81 is not limited, but may be configured by laminating, for example, a Ni layer, a Pd layer, and an Au layer, or may be Sn.

As shown in FIG. 8, the second external conductive film 82 includes a first conductive film 82A and a second conductive film 82B. The first conductive film 82A covers the lower surface 312 of the second through-electrode 31 exposed from the substrate 10, and the lower surface 412 of the third through-electrode 41 exposed from the substrate 10. The second conductive film 82B covers the side surface 414 of the third through-electrode 41, the side surface 424 of the third main surface wiring 42, and the side surface 434 of the columnar wiring 43. The first conductive film 82A covering the lower surface 312 of the second through-electrode 31 serves as a terminal for releasing heat, which is generated from the semiconductor device 1A, to the outside. The second external conductive film 82 is made of the same material as, for example, the first external conductive film 81. The second external conductive film 82 is composed of, for example, a plurality of metal layers laminated with each other. Examples of the metal layer may include a Ni layer and an Au layer. A material of the second external conductive film 82 is not limited, but may be configured by laminating, for example, a Ni layer, a Pd layer, and an Au layer, or may be Sn.

Operation

Next, an operation of the semiconductor device 1A of the present embodiment will be described. As shown in FIGS. 4 and 8, the semiconductor device 1A includes the heat-dissipating conductive portion 30 that overlaps with at least a portion of the semiconductor element 60 when viewed from the thickness direction Z, penetrates the substrate 10 from the substrate main surface 101 to the substrate back surface 102, and has higher thermal conductivity than that of the substrate 10. Therefore, the semiconductor device 1A can dissipate the heat, which is generated from the semiconductor element 60, to the outside of the semiconductor device 1A toward the substrate back surface 102 of the substrate 10.

The heat-dissipating conductive portion 30 includes one second through-electrode 31 that penetrates the substrate 10. The second through-electrode 31 is a flat plate having a rectangular shape when viewed from the thickness direction Z. Therefore, the heat-dissipating conductive portion 30 of the present embodiment has a small heat capacity and easily dissipates the heat of the semiconductor element 60.

The second through-electrode 31 of the heat-dissipating conductive portion 30 is a flat plate having a rectangular shape when viewed from the thickness direction Z. The second through-electrode 31 transfers heat in the first direction X and the second direction Y orthogonal to the thickness direction Z. Therefore, the heat-dissipating conductive portion 30 can dissipate the heat more efficiently by diffusing heat, which is locally generated in the element main surface 601 of the semiconductor element 60 such as a power transistor, toward the first direction X and the second direction Y orthogonal to the thickness direction Z.

The heat-dissipating conductive portion 30 is connected to the second connection pad 62 of the semiconductor element 60. The second connection pad 62 is a terminal that does not electrically affect the semiconductor element 60, and is, for example, a ground terminal. Therefore, the heat of the semiconductor element 60 can be dissipated without affecting electrical characteristics of the semiconductor element 60.

Figure 10A:
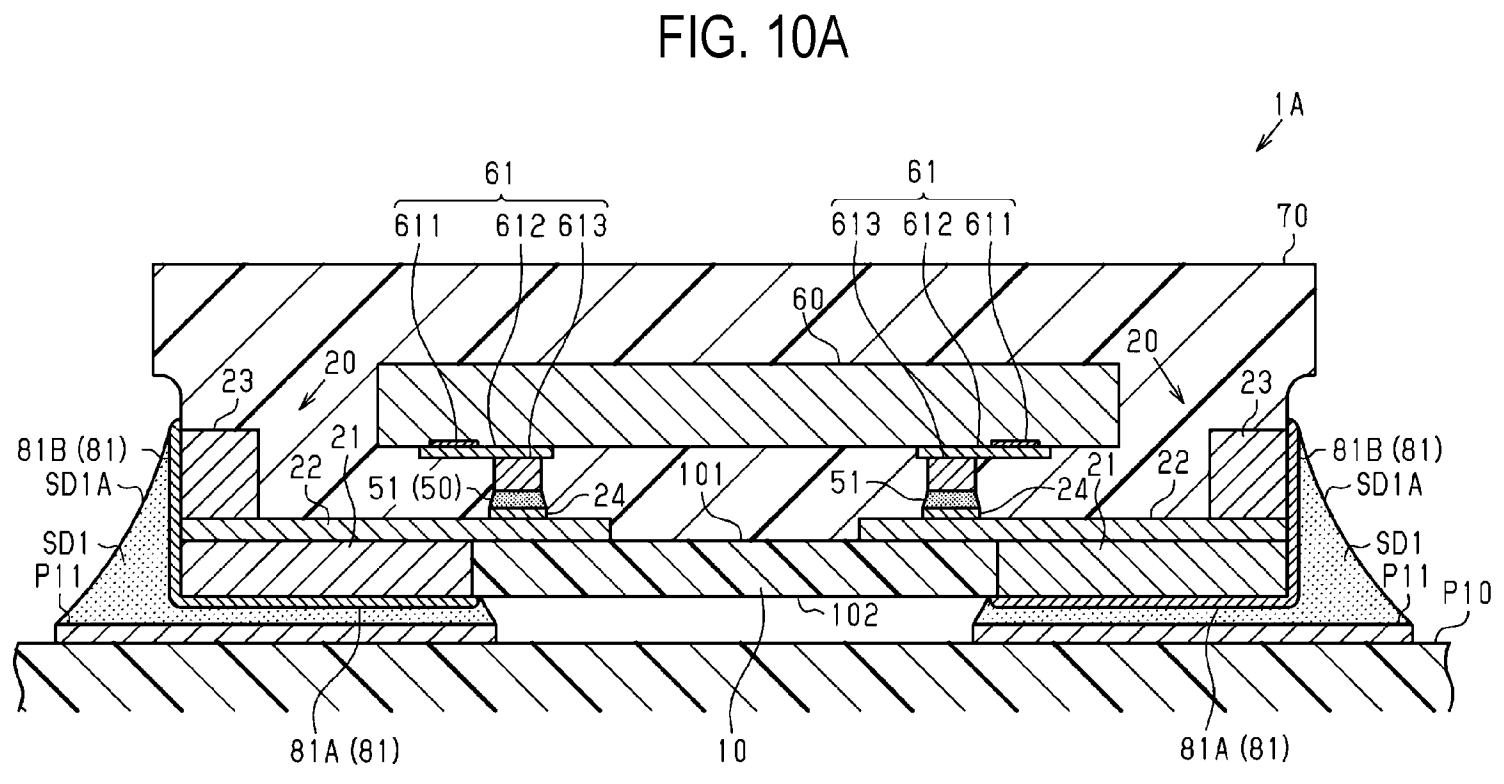
Figure 10B:
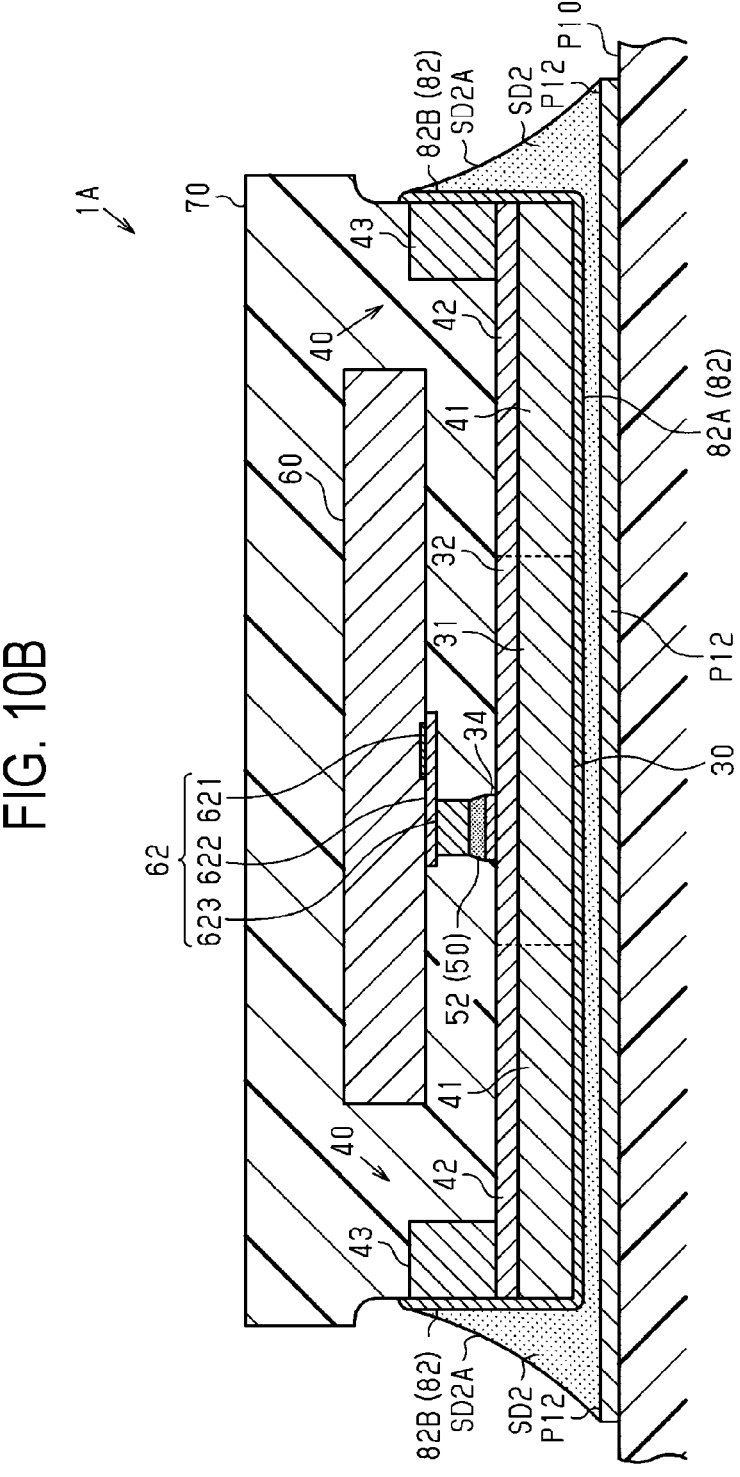
FIG. 10B is a cross-sectional view schematically showing a state in which the semiconductor device of one embodiment is mounted at a wiring board.

FIGS. 10A and 10B schematically show a state in which the semiconductor device 1A of one embodiment is mounted on a circuit board P10. FIG. 10A shows FIG. 7, that is, a cross-section taken along line 7-7 in FIG. 4, for the semiconductor device 1A of one embodiment. FIG. 10B shows FIG. 8, that is, a cross-section taken along line 8-8 in FIG. 4, for the semiconductor device 1A of one embodiment.

As shown in FIGS. 10A and 10B, the semiconductor device 1A is mounted on the circuit board P10. As shown in FIG. 10A, the first external conductive film 81 that covers the terminal portion 20 of the semiconductor device 1A is connected to a pattern P11 of the circuit board P10 by solder SD1. The solder SD1 includes a fillet SD 1A between the pattern P11 and the first external conductive film 81. The fillet SD 1A of the solder SD1 increases a bonding area between the solder SD1 and the first external conductive film 81 to further increase the connection strength. The fillet SD1A of the solder SD1 facilitates confirmation of a mounting state between the first external conductive film 81 and the pattern P11, that is, a mounting state of the terminal portion 20 of the semiconductor device 1A from the outside.

Similarly, as shown in FIG. 10B, the second external conductive film 82 that covers the heat-dissipating conductive portion 30 and the wiring portion 40 of the semiconductor device 1A is connected to a pattern P12 of the circuit board P10 by solder SD2. The heat of the semiconductor element 60 is transferred to the pattern P12 of the circuit board P10 via the heat-dissipating conductive portion 30, the second external conductive film 82, and the solder SD2. As a result, the heat of the semiconductor element 60 is dissipated to the circuit board P10. The solder SD2 includes a fillet SD2A between the pattern P12 and the second external conductive film 82. The fillet SD2A of the solder SD2 facilitates confirmation of a mounting state between the second external conductive film 82 and the pattern P12, that is, a mounting state of the heat-dissipating conductive portion 30 of the semiconductor device 1A from the outside.

Process of Manufacturing Semiconductor Device

An example of a method of manufacturing the semiconductor device 1A according to one embodiment of the present disclosure will be described with reference to FIGS. 11A, 11B to 22A, and 22B. Each referred figure shows a range in which one semiconductor device 1A is formed. FIGS. 11A to 22A show cross-sections corresponding to FIG. 7 in a manufacturing process. FIGS. 11B to 22B show cross-sections corresponding to FIG. 8 in the manufacturing process. Further, a definition of each direction shown in each figure is the same as a definition of a direction shown in FIGS. 1 to 8.

Figure 11A:
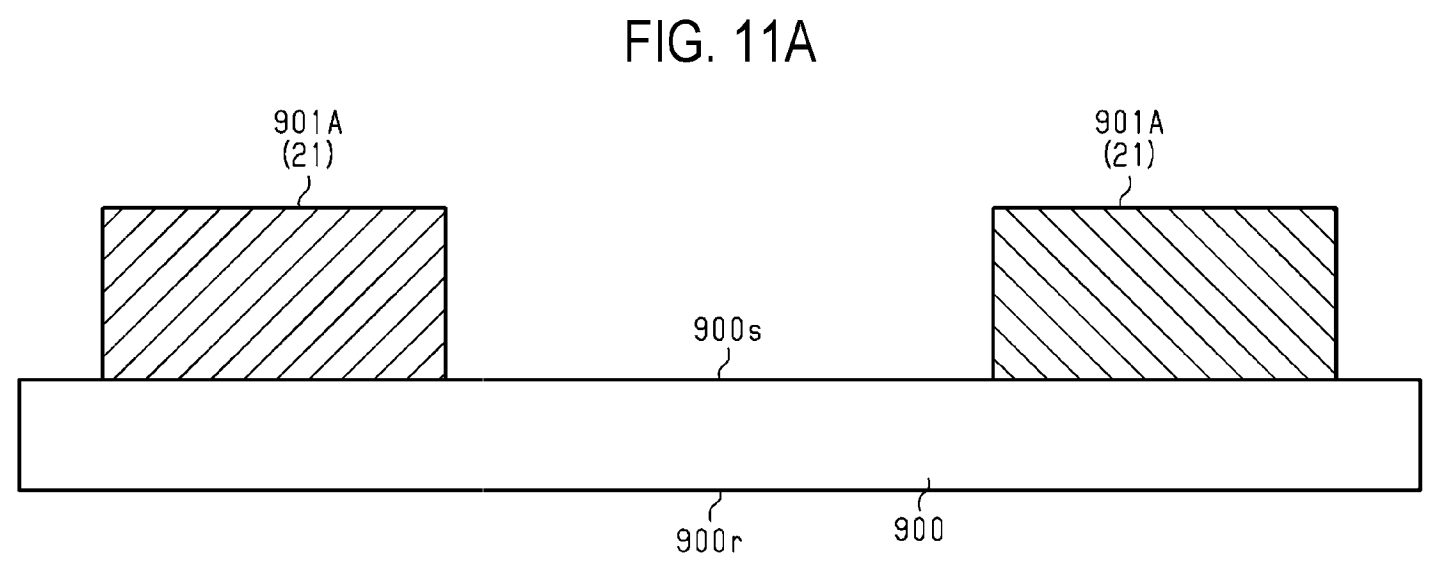
Figure 11B:
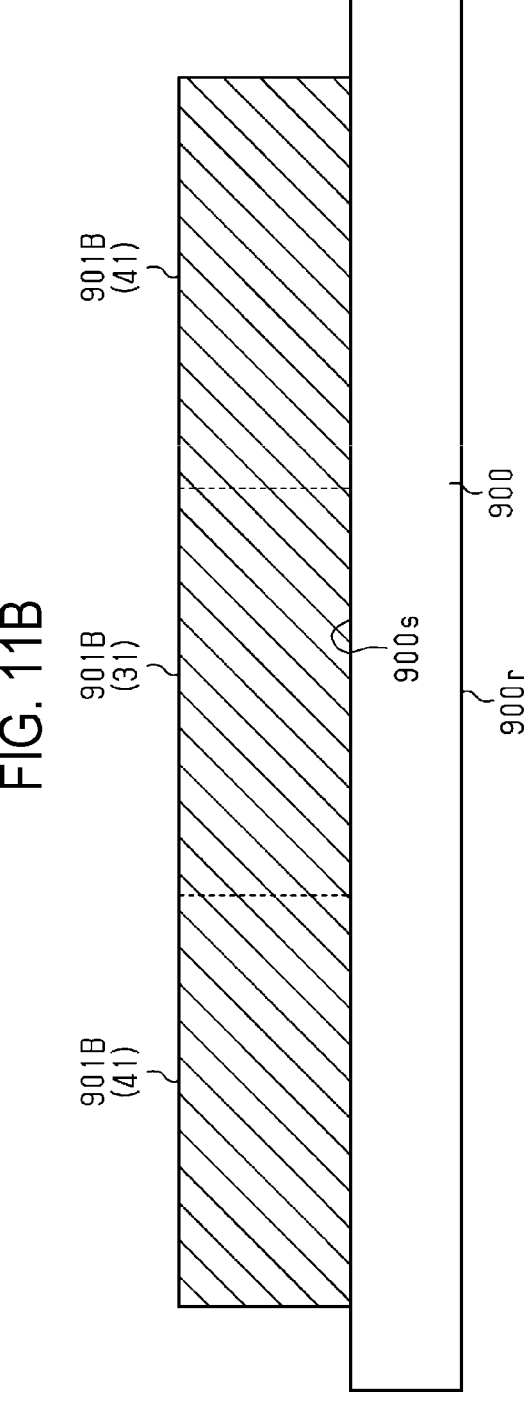
FIG. 11B is a schematic cross-sectional view showing a process of manufacturing the semiconductor device.

As shown in FIGS. 11A and 11B, the method for manufacturing the semiconductor device 1A includes a step of preparing a support substrate 900. The support substrate 900 is made of, for example, a Si single crystal material. The support substrate 900 includes a main surface 900s and a lower surface 900r facing opposite to each other in the thickness direction Z. As the support substrate 900, a substrate made of a synthetic resin material such as an epoxy resin may be used.

Further, as shown in FIGS. 11A and 11B, the method for manufacturing the semiconductor device 1A includes a step of forming terminal pillars 901A and 901B. As shown in FIG. 11A, the terminal pillar 901A is formed on the main surface 900s of the support substrate 900. Further, as shown in FIG. 11B, the terminal pillar 901B is formed on the main surface 900s of the support substrate 900. The terminal pillars 901A and 901B are made of, for example, Cu or an alloy containing Cu as a main component. The terminal pillars 901A and 901B are formed by, for example, an electrolytic plating method. The terminal pillar 901A serves as the first through-electrode 21 in the above-described semiconductor device 1A, and the terminal pillar 901B serves as the second through-electrode 31 and the third through-electrode 41 in the above-described semiconductor device 1A. The terminal pillar 901A is formed to be thicker than the thickness of the first through-electrode 21 shown in FIG. 7. The terminal pillar 901B is formed to be thicker than the thicknesses of the second through-electrode 31 and the third through-electrode 41 shown in FIG. 8.

The terminal pillars 901A and 901B are formed, for example, through a step of forming a seed layer, a step of forming a mask on the seed layer by photolithography, and a step of forming a plating layer in contact with the seed layer. For example, the seed layer is formed on the main surface 900s of the support substrate 900 by a sputtering method. Next, for example, the seed layer is covered with a resist layer having photosensitivity, and the resist layer is exposed to light and developed to form a mask including an opening. Next, plated metal is precipitated on a surface of the seed layer, which is exposed from the mask, by an electrolytic plating method using the seed layer as a conductive path, to form the terminal pillars 901A and 901B. After forming the terminal pillars 901A and 901B, the mask is removed. The terminal pillars 901A and 901B may be formed of Cu columnar material.

Figure 12A:
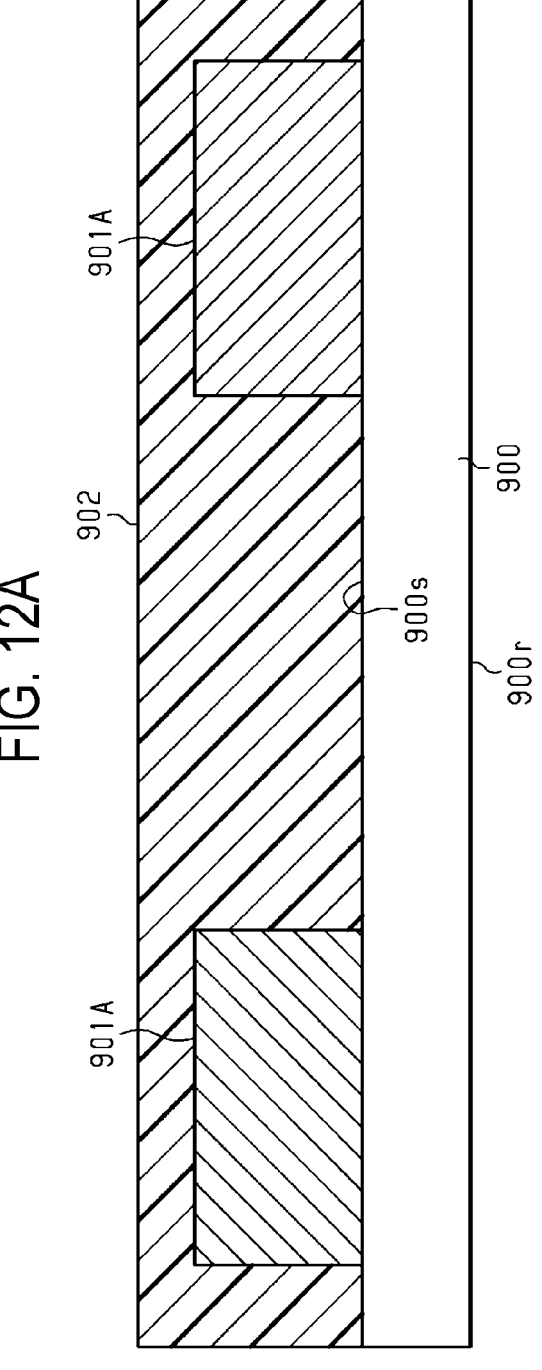
FIG. 12A is a schematic cross-sectional view showing a process of manufacturing the semiconductor device.
Figure 12B:
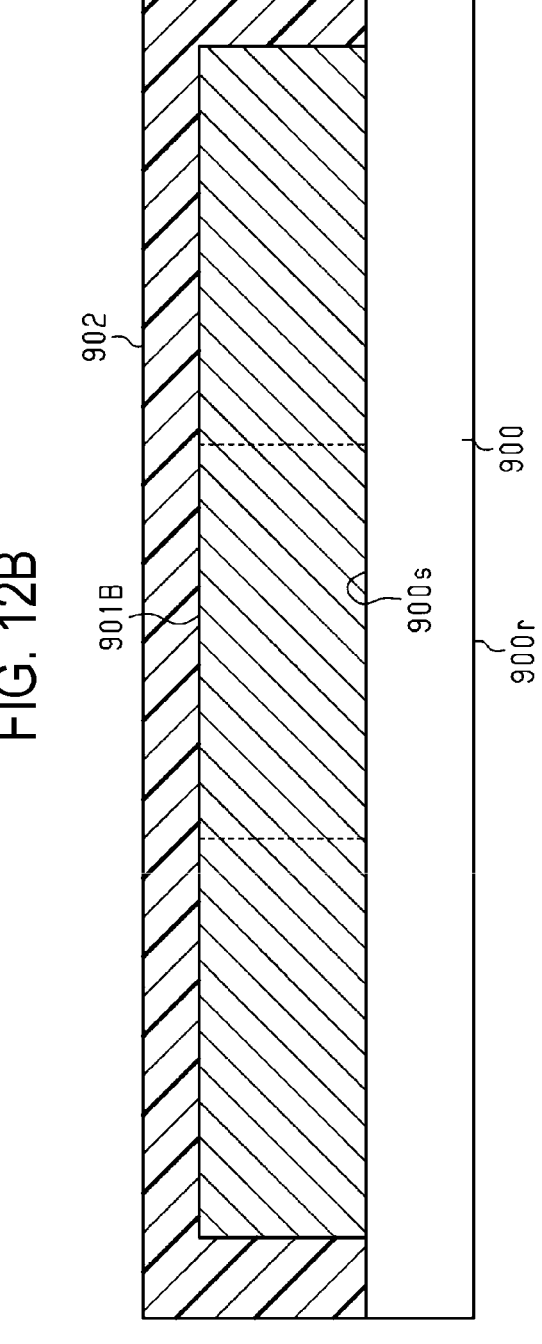
FIG. 12B is a schematic cross-sectional view showing a process of manufacturing the semiconductor device.

As shown in FIGS. 12A and 12B, the method for manufacturing the semiconductor device 1A includes a step of forming a base material 902. The base material 902 is formed to be in contact with the main surface 900s of the support substrate 900 and to cover upper surfaces and side surfaces of the terminal pillars 901A and 901B. As a material of the base material 902, the material constituting the substrate 10 shown in FIGS. 1 to 9 can be used. In the present embodiment, as the material of the base material 902, a synthetic resin containing an epoxy resin or the like as a main component can be used.

Figure 13A:
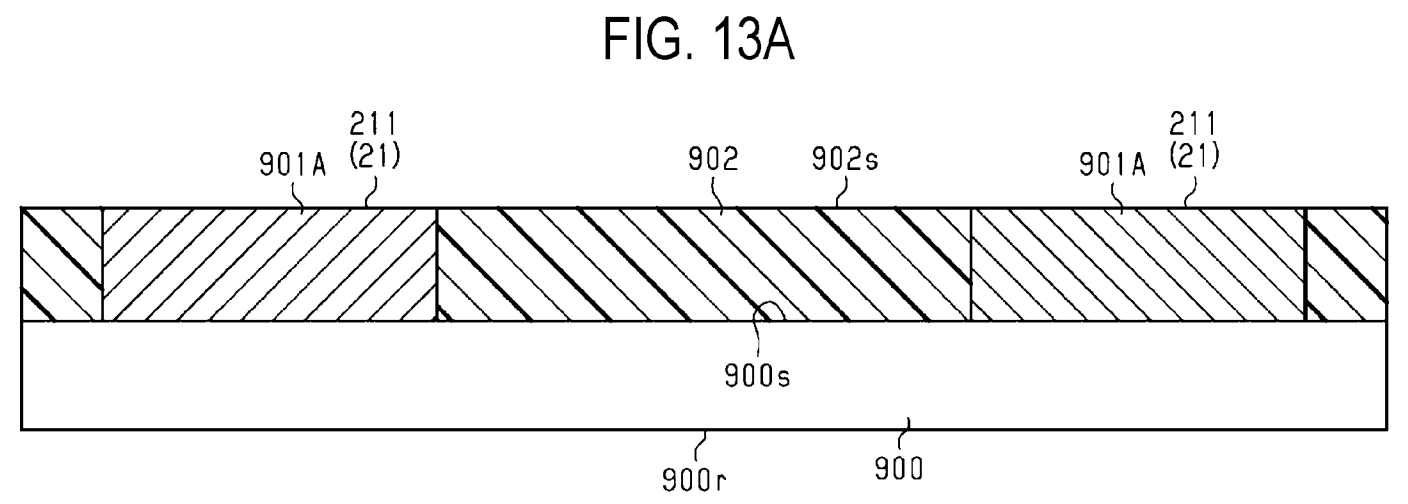
Figure 13B:
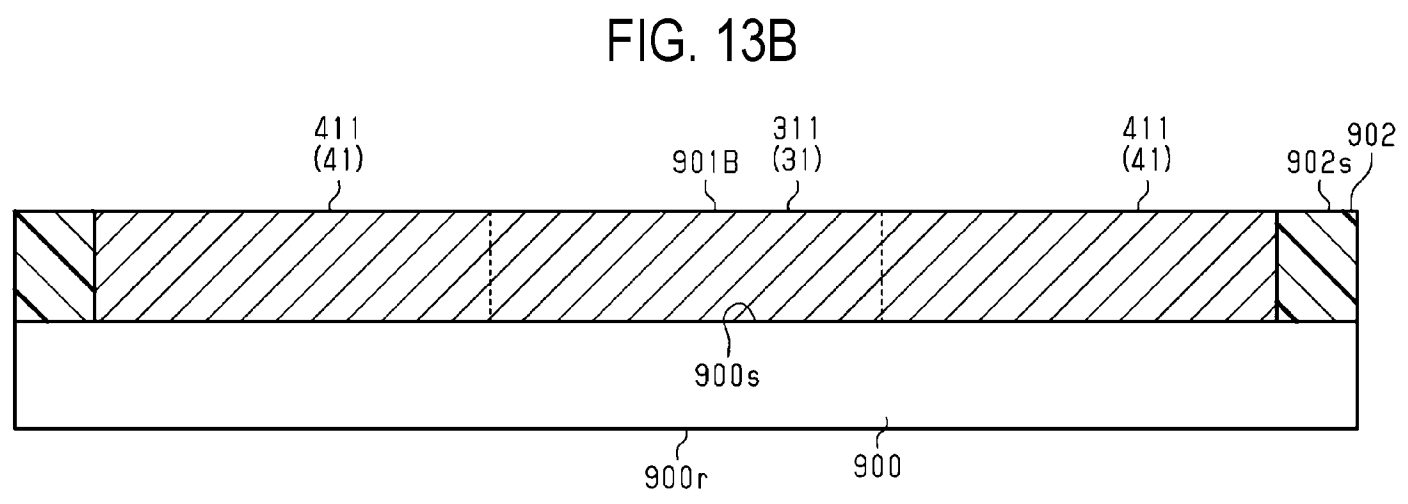

As shown in FIGS. 13A and 13B, the method for manufacturing the semiconductor device 1A includes a step of removing portions of the base material 902 and the terminal pillars 901A and 901B by grinding. The base material 902 is left to be thicker than a thickness of the substrate 10 shown in FIGS. 1 to 9. By grinding, the upper surface 211 of the first through-electrode 21, the upper surface 311 of the second through-electrode 31, and the upper surface 411 of the third through-electrode 41 are exposed on a base material main surface 902s of the base material 902. Then, burrs of the terminal pillars 901A and 901B generated by grinding are removed from the base material main surface 902s of the base material 902 by etching, for example, wet etching.

Figure 14A:
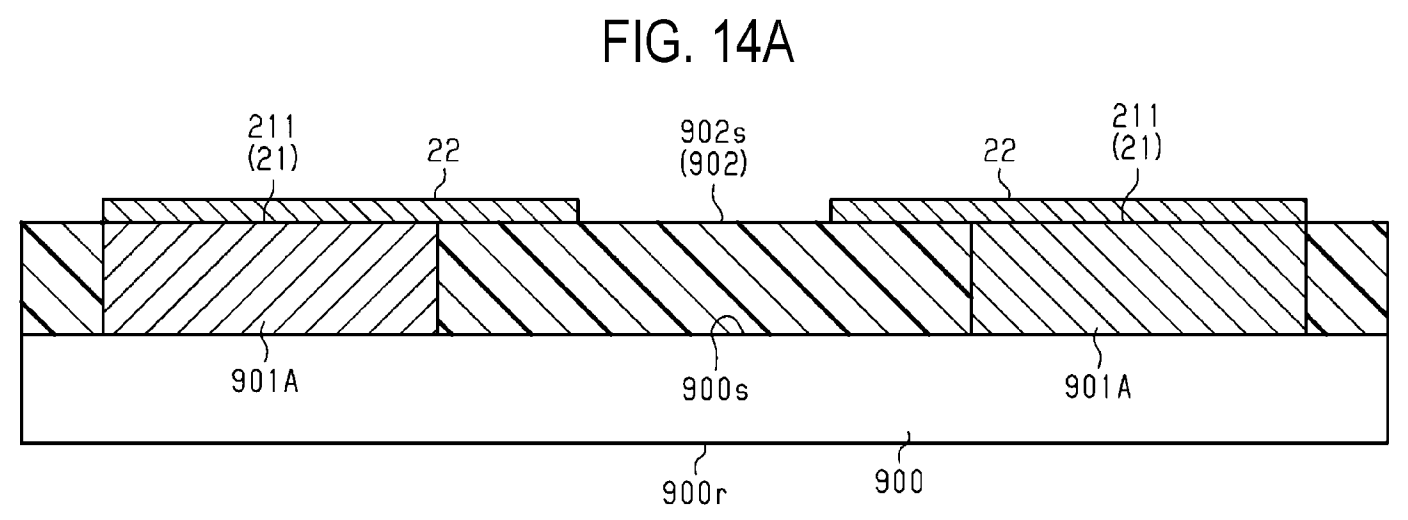
Figure 14B:
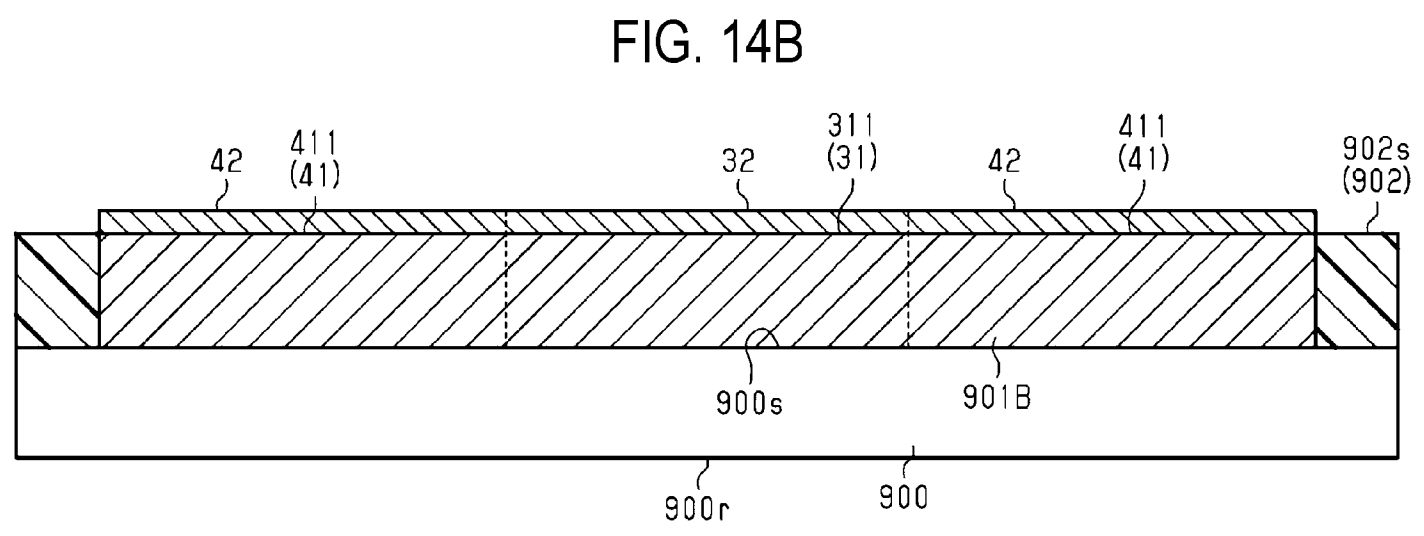

As shown in FIGS. 14A and 14B, the method of manufacturing the semiconductor device 1A includes a step of forming the first main surface wiring 22, the second main surface wiring 32, and the third main surface wiring 42. The step of forming the first main surface wiring 22, the second main surface wiring 32, and the third main surface wiring 42 includes a step of forming a seed layer and a step of forming a conductive layer. The seed layer and the conductive layer constitute the metal layer and the conductive layer of the first main surface wiring 22, the second main surface wiring 32, and the third main surface wiring 42.

First, the seed layer is formed by, for example, a sputtering method. The seed layer includes, for example, a first layer containing Ti as a main component, and a second layer containing Cu as a main component. The seed layer is formed to cover the base material main surface 902s of the base material 902 and the upper surfaces 211, 311, and 411 of the through-electrodes 21, 31, and 41. Next, a mask including an opening is formed by photolithography using, for example, a photosensitive resist layer. Next, for example, plated metal is precipitated on a surface of the seed layer, which is exposed from the opening of the mask, by an electrolytic plating method using the seed layer as a conductive path, to form the conductive layer. The seed layer is removed at an appropriate time.

Figure 15A:
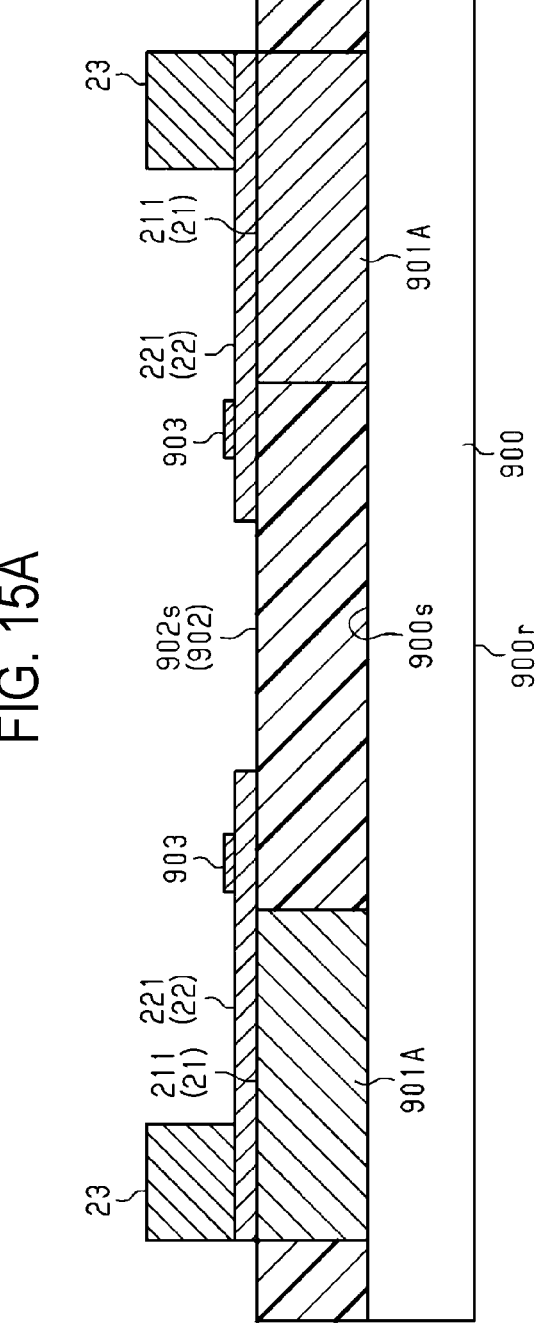
FIG. 15A is a schematic cross-sectional view showing a process of manufacturing the semiconductor device.
Figure 15B:
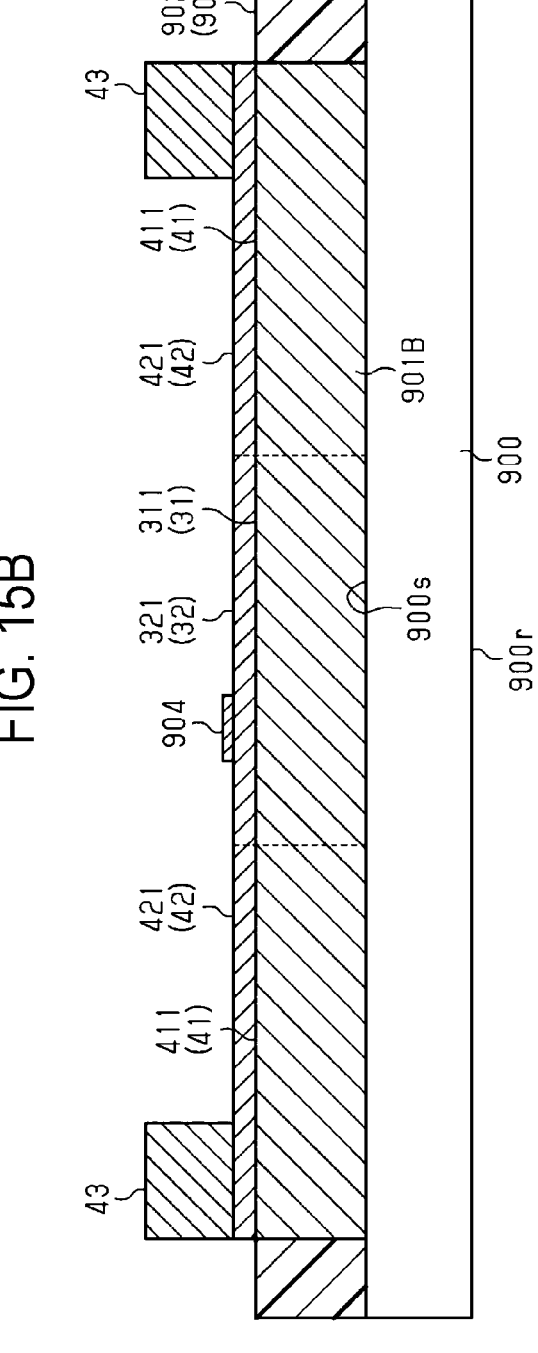
FIG. 15B is a schematic cross-sectional view showing a process of manufacturing the semiconductor device.

As shown in FIGS. 15A and 15B, the method of manufacturing the semiconductor device 1A includes a step of forming the columnar wirings 23 and 43. First, a mask including an opening is formed by photolithography using, for example, a photosensitive resist layer. Next, plated metal is precipitated on surfaces of the main surface wirings 22, 32, and 42, which are exposed from the opening of the mask, by an electrolytic plating method using the main surface wirings 22, 32, and 42 as a conductive path, to form the columnar wirings 23 and 43. After forming the columnar wirings 23 and 43, the mask is removed. The columnar wirings 23 and 43 may be formed of a Cu columnar material.

Further, the method of manufacturing the semiconductor device 1A includes a step of forming bonding portions 903 and 904. The bonding portion 903 shown in FIG. 15A includes the wiring electrode 24 and the bonding member 51 shown in FIG. 7. The bonding portion 904 shown in FIG. 15B includes the wiring electrode 34 and the bonding member 52 shown in FIG. 8.

First, a mask including an opening is formed by photolithography using, for example, a photosensitive resist layer. Next, plated metal is precipitated on surfaces of the main surface wirings 22, 32, and 42, which are exposed from the opening of the mask, by, for example, an electrolytic plating method, to form a metal layer to be the wiring electrodes 24 and 34. Next, a solder layer is formed on an upper surface of the metal layer. The solder layer serves as the bonding members 51 and 52, or a portion thereof. The solder layer is formed by, for example, an electrolytic plating method. After forming the bonding portions 903 and 904, the mask is removed.

Figure 16A:
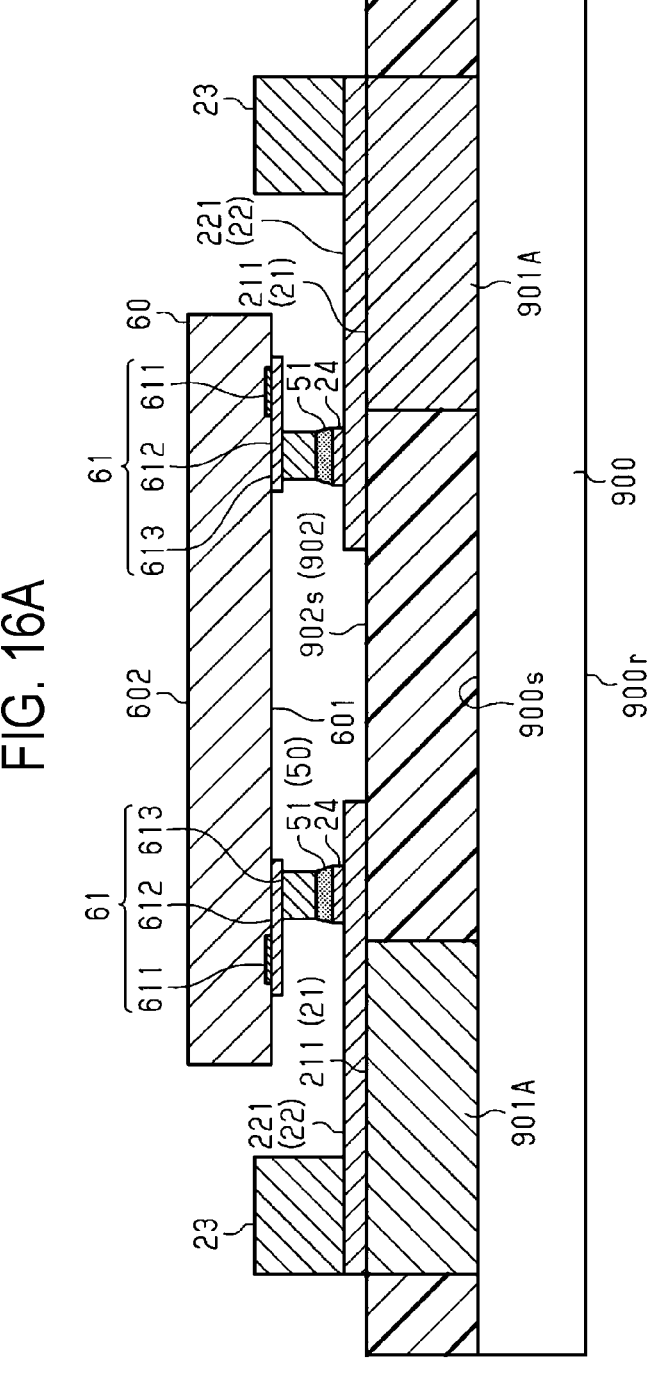
FIG. 16A is a schematic cross-sectional view showing a process of manufacturing the semiconductor device.
Figure 16B:
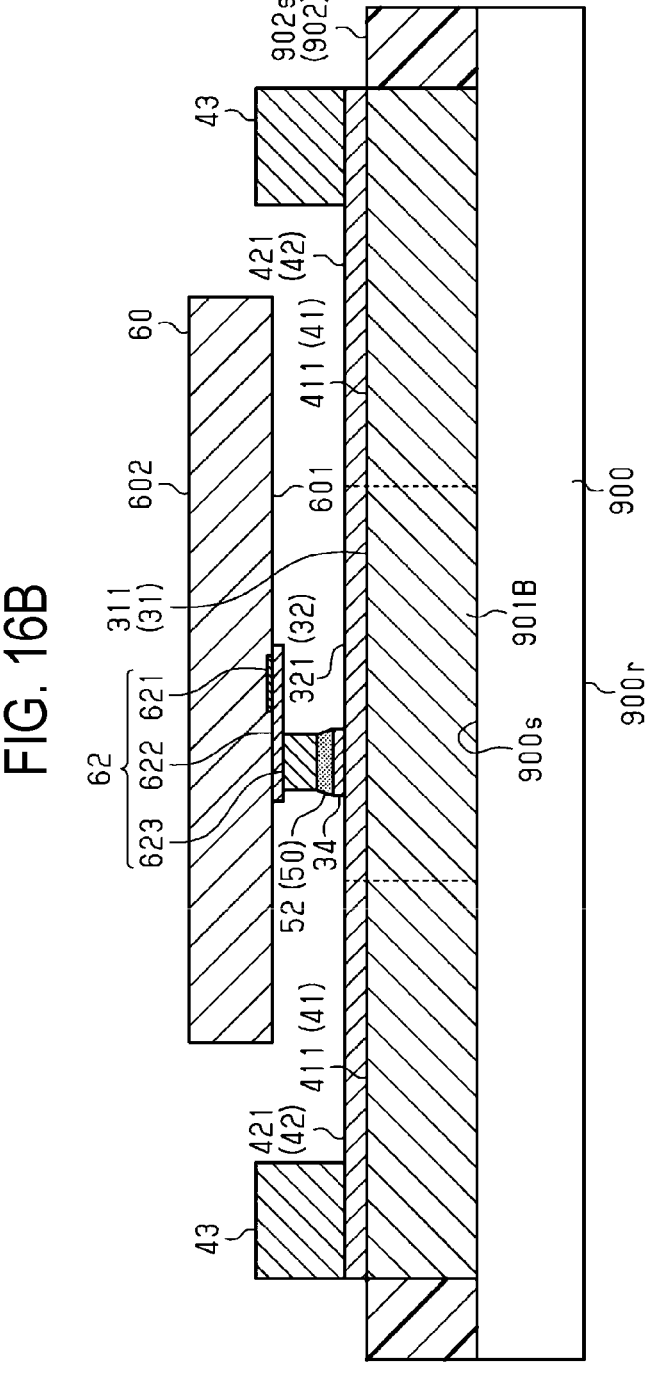
FIG. 16B is a schematic cross-sectional view showing a process of manufacturing the semiconductor device.

The method of manufacturing the semiconductor device 1A may include a step of performing a flow process. A surface of the solder layer is flattened by the flow process. As shown in FIGS. 16A and 16B, the method of manufacturing the semiconductor device 1A includes a step of mounting the semiconductor element 60. This step includes a step of flip-chip mounting the semiconductor element 60 and a reflow step. The semiconductor element 60 is arranged such that the element main surface 601 faces the base material 902. The semiconductor element 60 is flip-chip mounted by applying a flux to the first element electrode 613 and the second element electrode 623 by using, for example, a flip chip bonder. Next, the first bonding member 51 and the second bonding member 52 are formed by the reflow process.

Figure 17A:
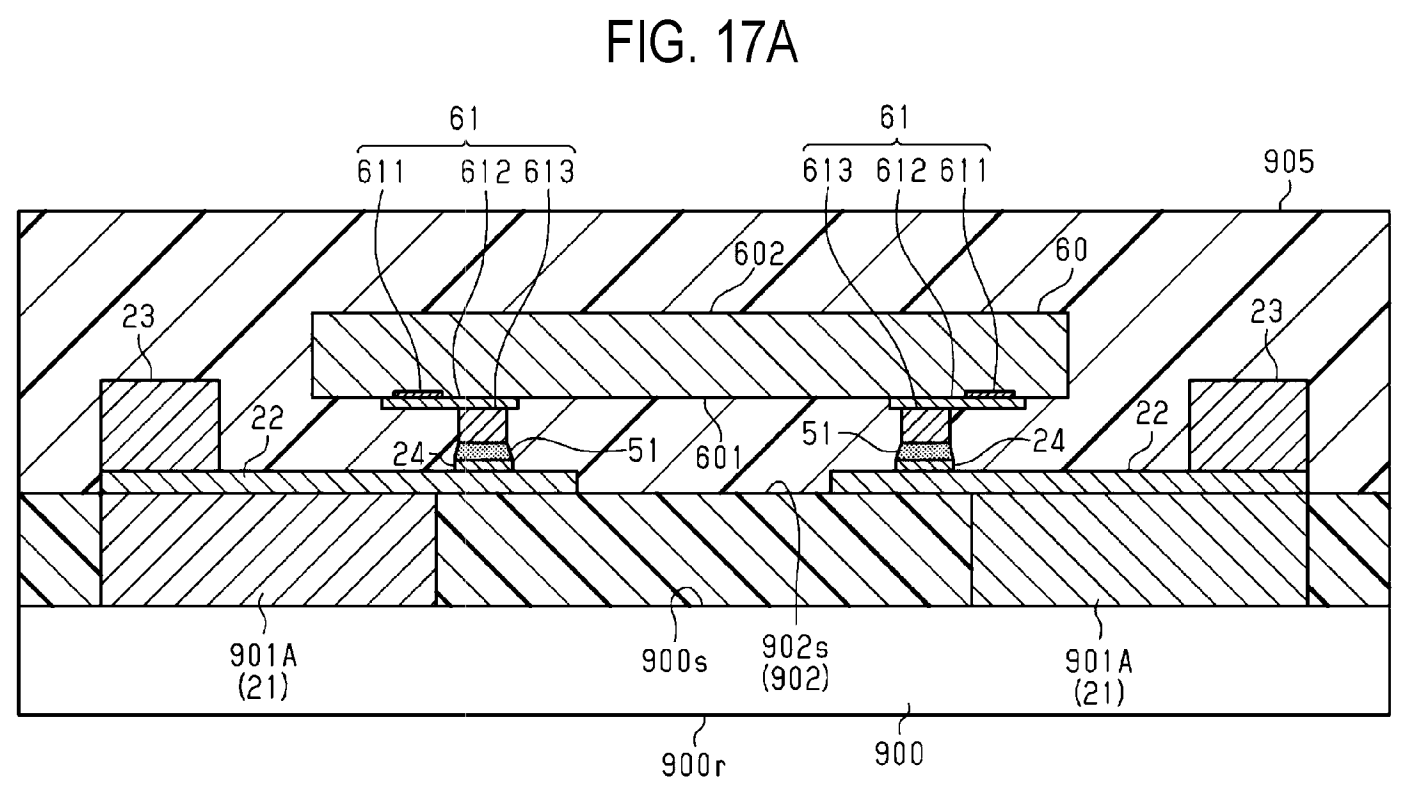
Figure 17B:
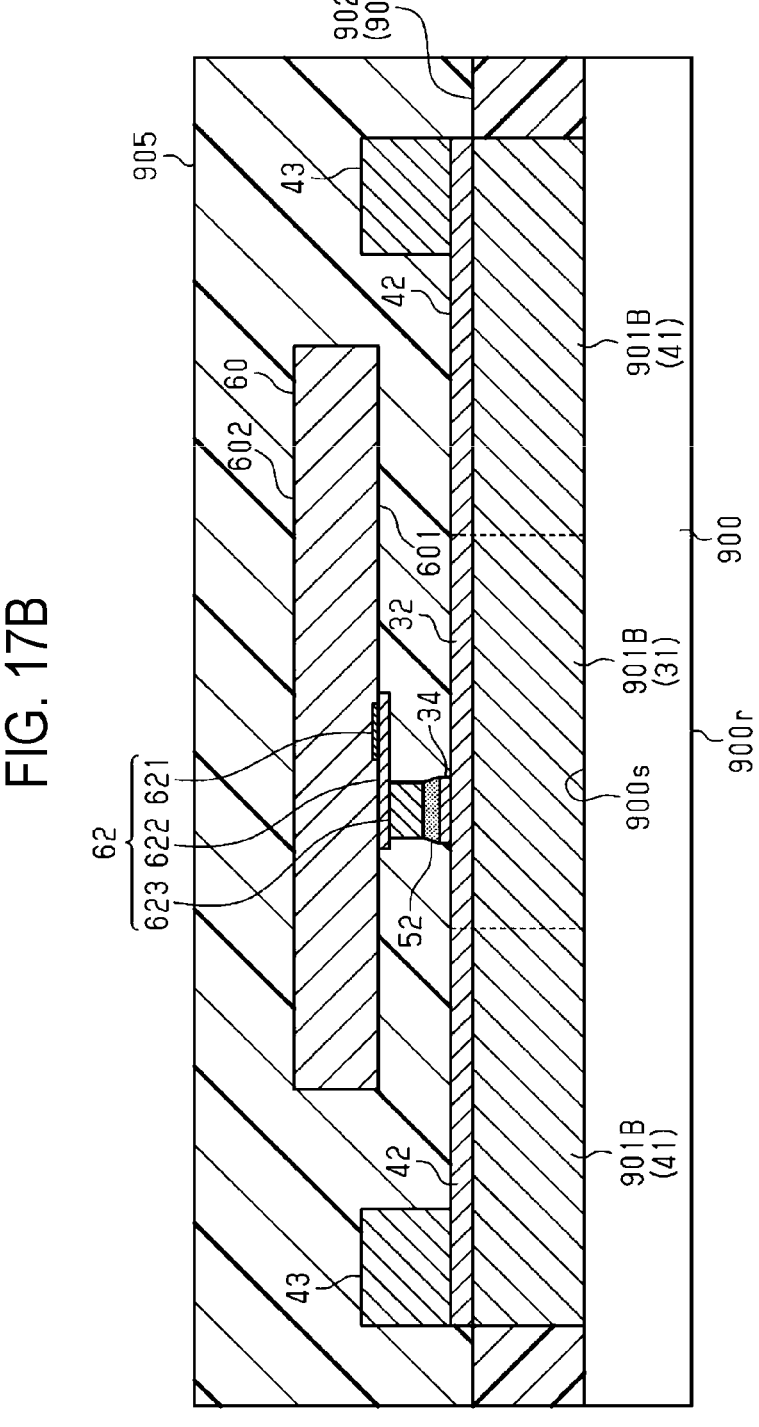
FIG. 17B is a schematic cross-sectional view showing a process of manufacturing the semiconductor device.

As shown in FIGS. 17A and 17B, the method of manufacturing the semiconductor device 1A includes a step of forming a resin layer 905. The resin layer 905 is formed to cover the base material main surface 902s of the base material 902 and the semiconductor element 60. The resin layer 905 is a member serving as the sealing resin 70 shown in FIGS. 1 to 9. The resin layer 905 is, for example, a synthetic resin containing an epoxy resin as a main material. The resin layer 905 is formed, for example, by compression molding. The resin layer 905 is filled between the element main surface 601 of the semiconductor element 60 and the base material main surface 902s of the base material 902.

Figure 18A:
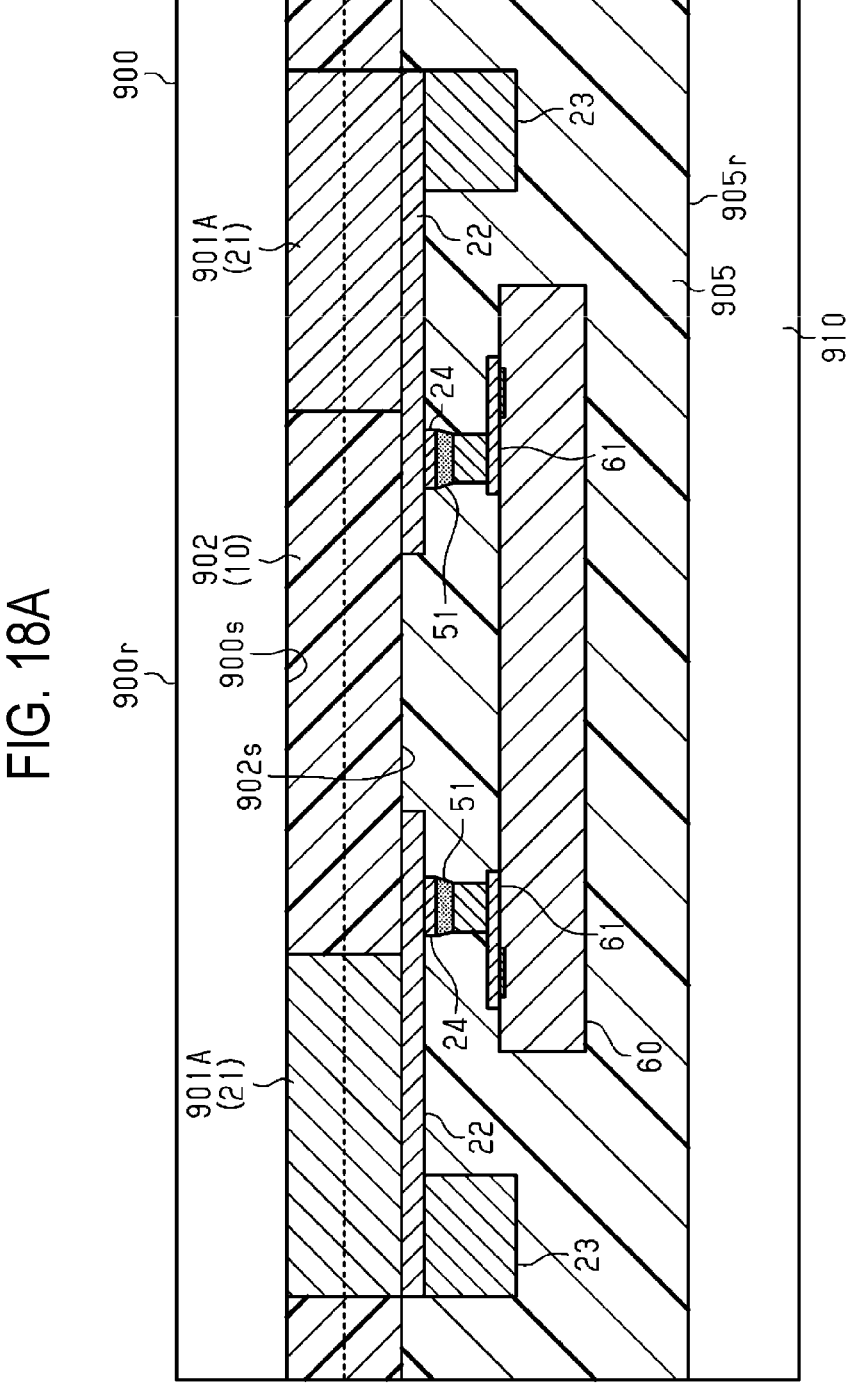
FIG. 18A is a schematic cross-sectional view showing a process of manufacturing the semiconductor device.
Figure 18B:
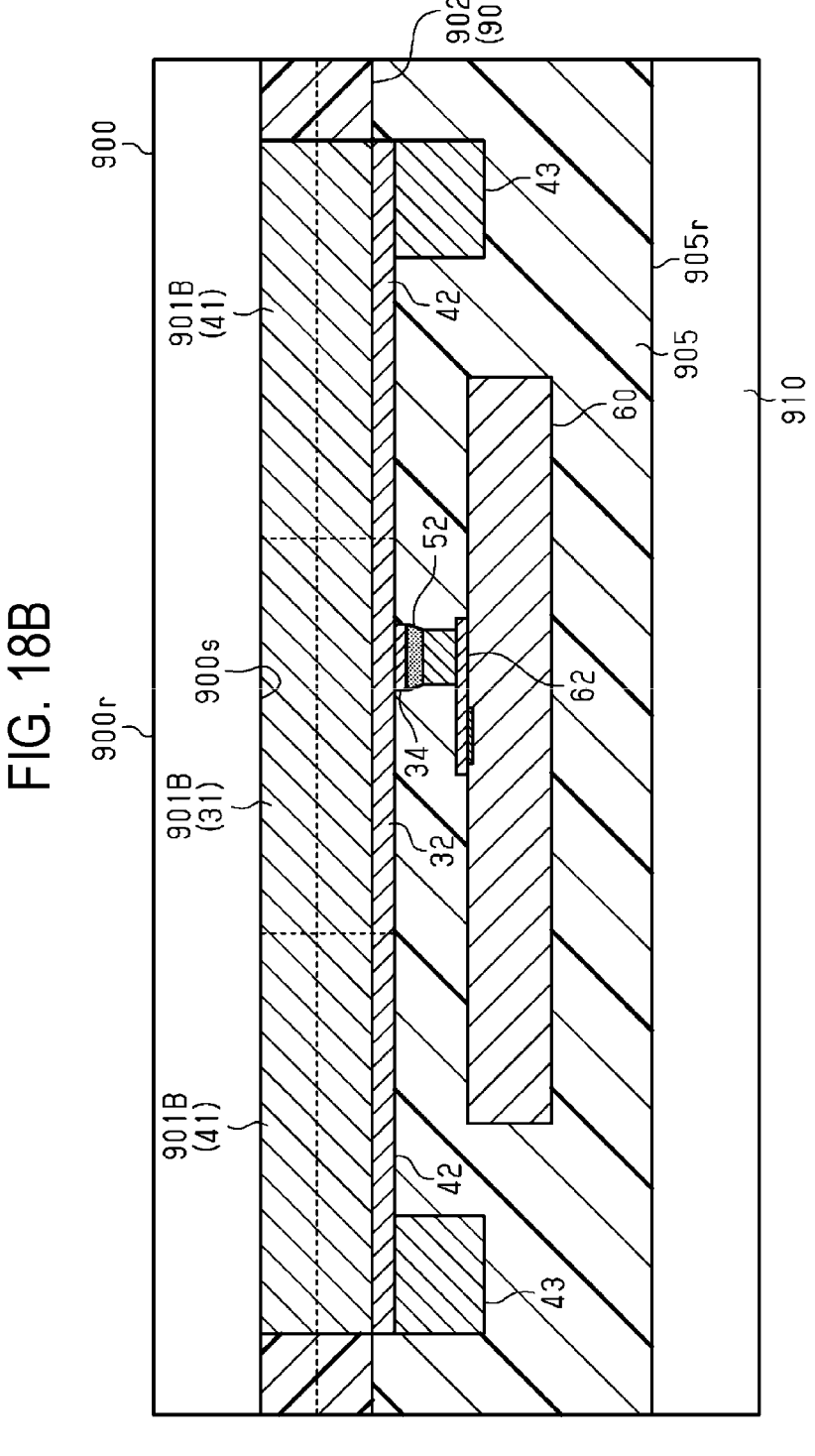
FIG. 18B is a schematic cross-sectional view showing a process of manufacturing the semiconductor device.
Figure 19A:
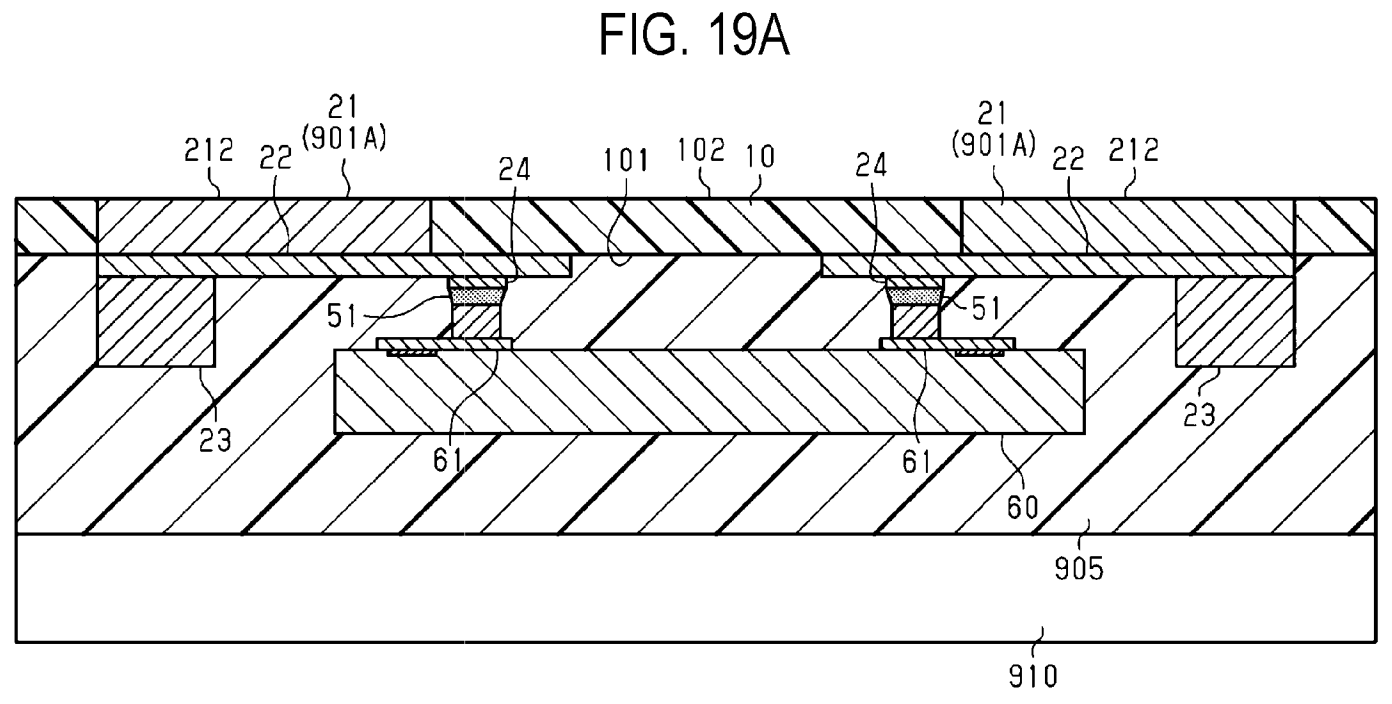
Figure 19B:
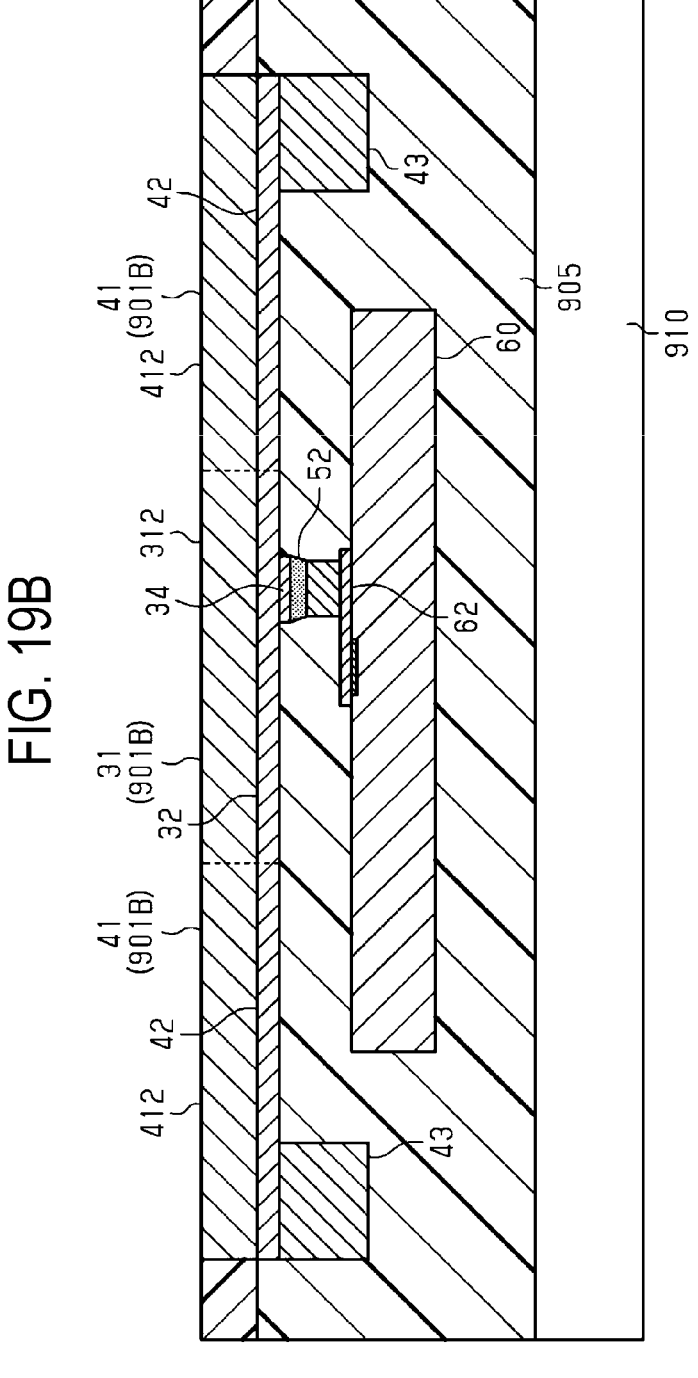
FIG. 19B is a schematic cross-sectional view showing a process of manufacturing the semiconductor device.

As shown in FIGS. 18A, 18B, 19A, and 19B, the method of manufacturing the semiconductor device 1A includes a step of removing the support substrate 900. As shown in FIGS. 18A and 18B, a dicing tape 910 is attached to a lower surface 905r of the resin layer 905. It should be noted that FIGS. 18A and 18B are shown upside down with respect to FIGS. 17A and 17B. Then, for example, the support substrate 900 is removed by grinding, and portions of the base material 902, the first terminal pillar 901A, and the second terminal pillar 901B are ground. At this time, the base material 902, the first terminal pillar 901A, and the second terminal pillar 901B are ground from a side of the support substrate 900 up to a broken line shown in FIGS. 18A and 18B. After peeling off the support substrate 900, the base material 902, the first terminal pillar 901A, and the second terminal pillar 901B may be ground. As a result, as shown in FIGS. 19A and 19B, the substrate 10, the first through-electrode 21, the second through-electrode 31, and the third through-electrode 41 penetrating the substrate 10 are formed. As shown in FIG. 19B, the heat-dissipating conductive portion 30 is configured by the second through-electrode 31 and the second main surface wiring 32.

Figure 20A:
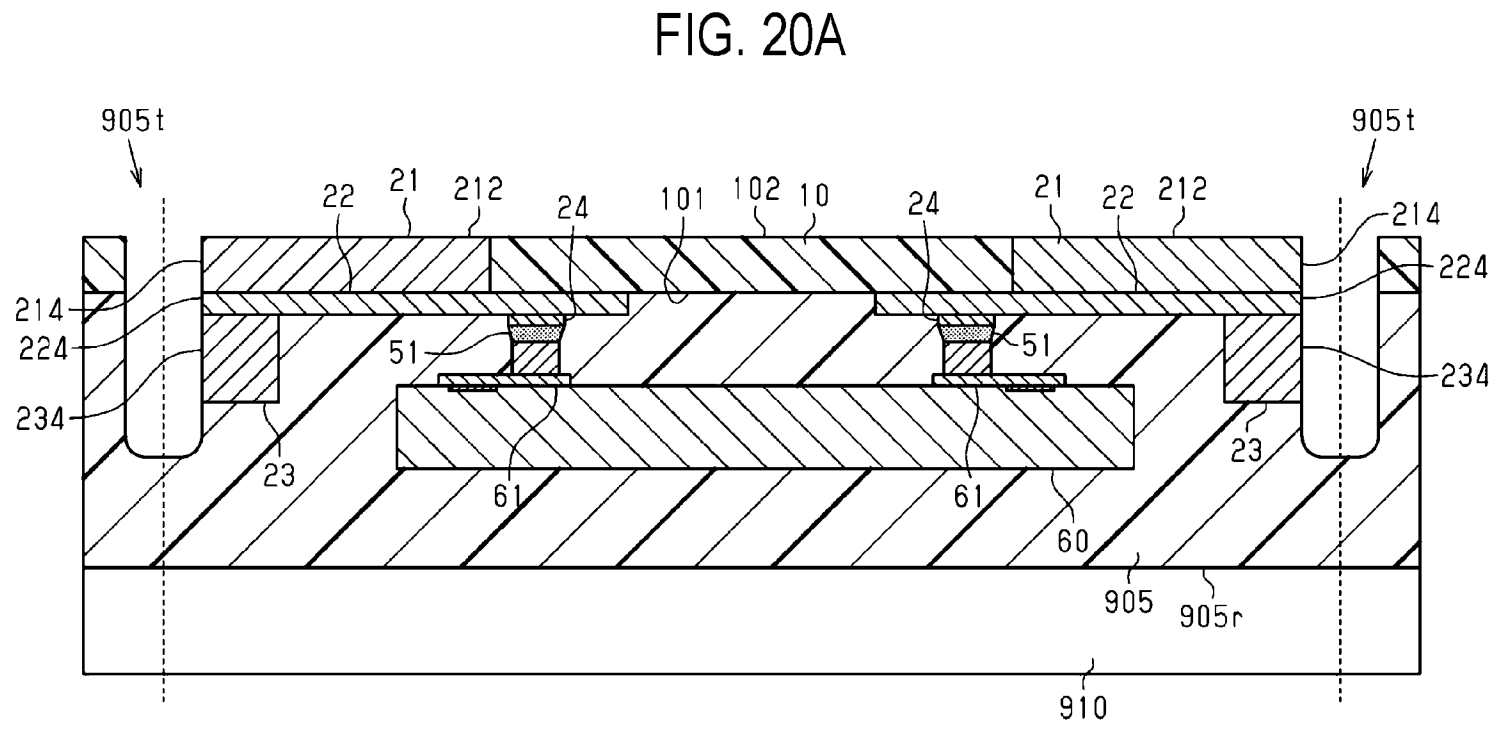
Figure 20B:
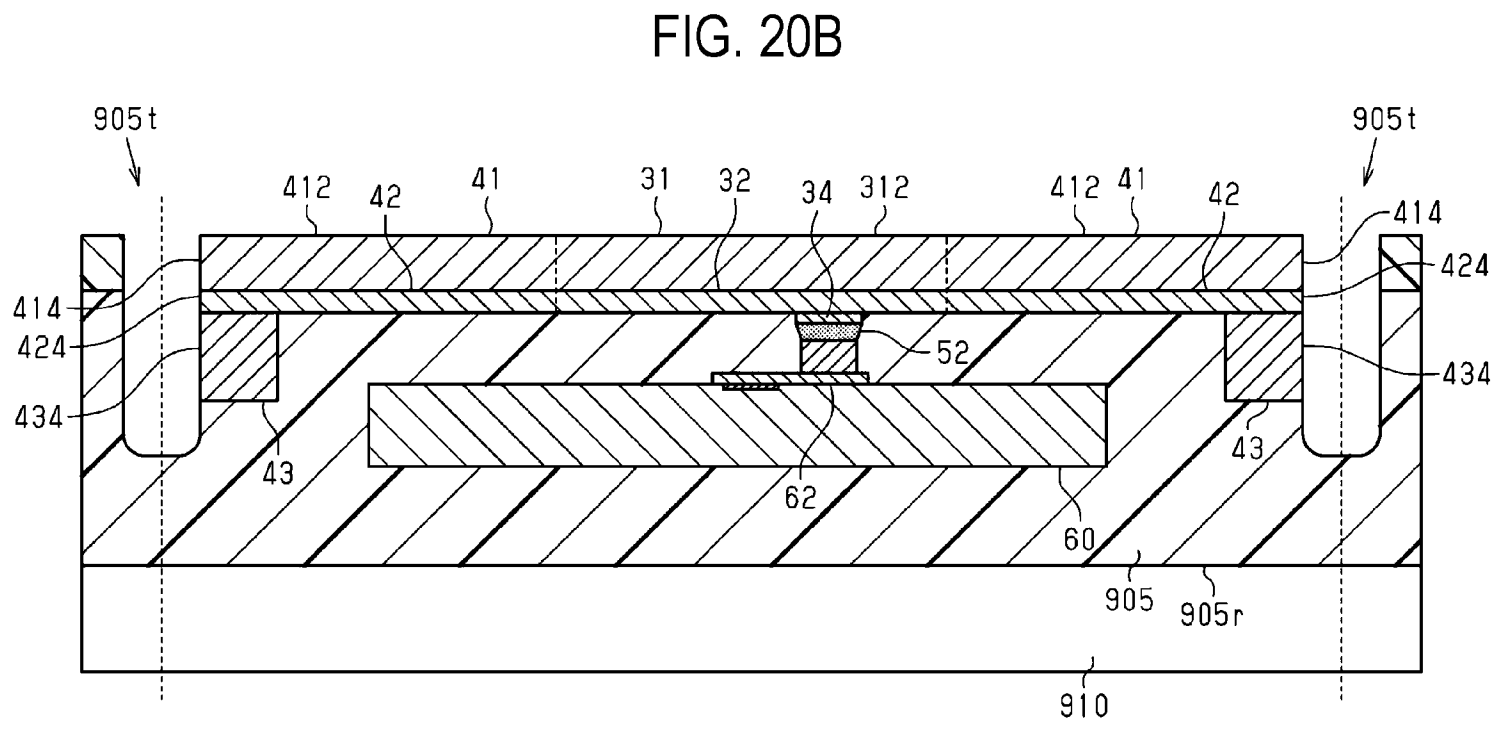

As shown in FIGS. 20A and 20B, the method of manufacturing the semiconductor device 1A includes a step of cutting the base material 902 and cutting (half-cutting) a portion of the resin layer 905 in the thickness direction Z. In such cutting of the base material 902 and half-cutting of the resin layer 905, for example, a dicing blade is used to cut along a cutting line (broken line) shown in FIGS. 20A and 20B from a side of the base material 902 toward the lower surface 905r of the resin layer 905. By half-cutting the resin layer 905 in this way, a separation groove 905t is formed in the resin layer 905. Then, the first main surface wiring 22 is cut by the cutting of the base material 902 and the half-cutting of the resin layer 905 with the dicing blade. As a result, as shown in FIG. 20A, the substrate 10, the first main surface wiring 22, and the columnar wiring 23 are formed. More specifically, the side surface 214 of the first through-electrode 21, the side surface 224 of the first main surface wiring 22, and the side surface 234 of the columnar wiring 23 are formed. The side surface 214 of the first through-electrode 21, the side surface 224 of the first main surface wiring 22, and the side surface 234 of the columnar wiring 23 are exposed to the separation groove 905t. The terminal portion 20 includes the first through-electrode 21, the first main surface wiring 22, and the columnar wiring 23 formed in this way. Further, as shown in FIG. 20B, the third main surface wiring 42 and the columnar wiring 43 are formed. More specifically, the side surface 414 of the third through-electrode 41, the side surface 424 of the third main surface wiring 42, and the side surface 434 of the columnar wiring 43 are formed. The side surface 414 of the third through-electrode 41, the side surface 424 of the third main surface wiring 42, and the side surface 434 of the columnar wiring 43 are exposed to the separation groove 905t. The third through-electrode 41, the third main surface wiring 42, and the columnar wiring 43 formed thereby constitute the wiring portion 40.

Figure 21A:
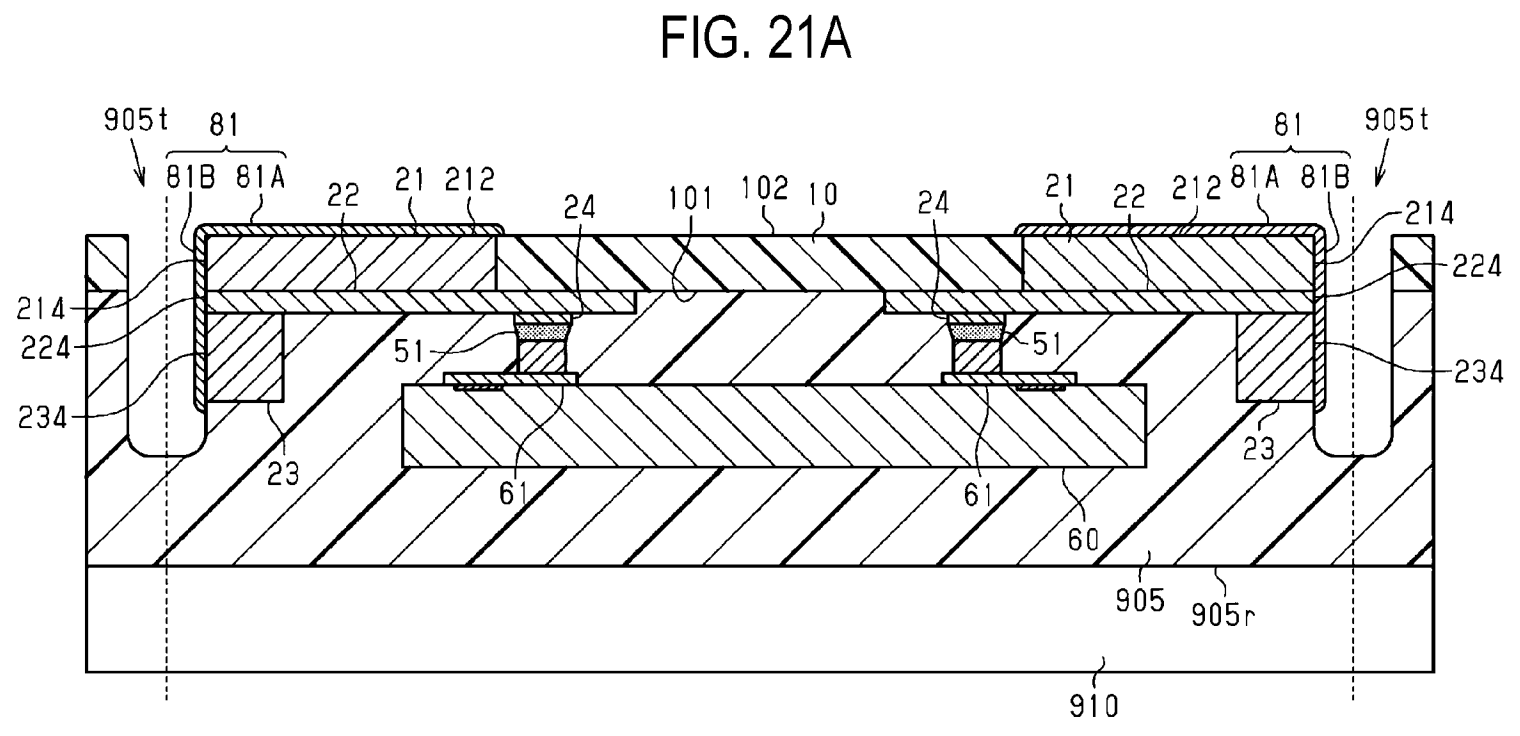
Figure 21B:
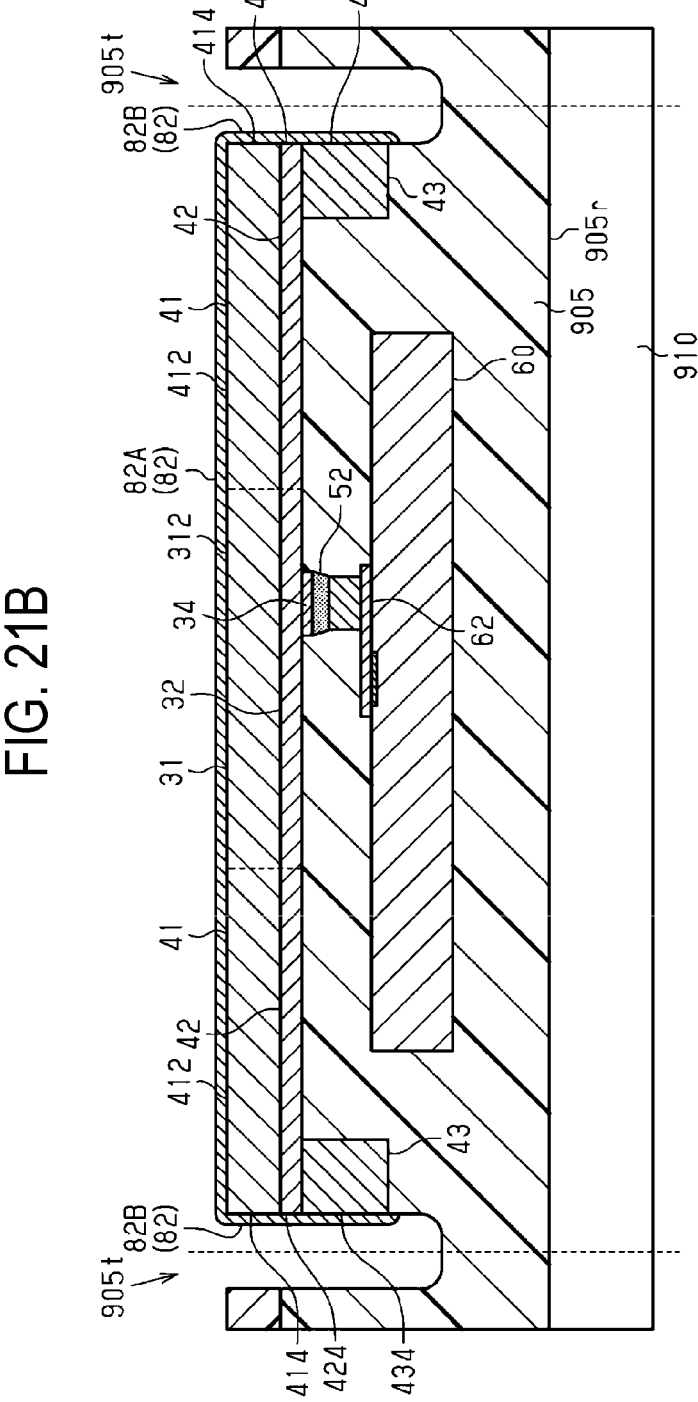
FIG. 21B is a schematic cross-sectional view showing a process of manufacturing the semiconductor device.

As shown in FIGS. 21A and 21B, the method of manufacturing the semiconductor device 1A includes a step of forming the first external conductive film 81 and the second external conductive film 82. As shown in FIG. 21A, the first external conductive film 81 includes the first conductive film 81A that covers the lower surface 212 of the first through-electrode 21, and the second conductive film 81B that covers the side surfaces 214, 224, and 234 of the first through-electrode 21, the first main surface wiring 22, and the columnar wiring 23, respectively. The second conductive film 81B is formed in the separation groove 905t. As shown in FIG. 21B, the second external conductive film 82 includes the first conductive film 82A and the second conductive film 82B. The first conductive film 82A covers the lower surface 312 of the second through-electrode 31 and the lower surface 412 of the third through-electrode 41. The second conductive film 82B covers the side surfaces 414, 424, and 434 of the third through-electrode 41, the third main surface wiring 42, and the columnar wiring 43, respectively. The second conductive film 82B is formed in the separation groove 905t.

The first external conductive film 81 and the second external conductive film 82 are each made of plated metal. For example, the first external conductive film 81 and the second external conductive film 82 are formed by precipitating plated metals such as Ni, Pd, and Au in this order by electroless plating. A structure and forming method of each of the first external conductive film 81 and the second external conductive film 82 are not limited.

Figure 22A:
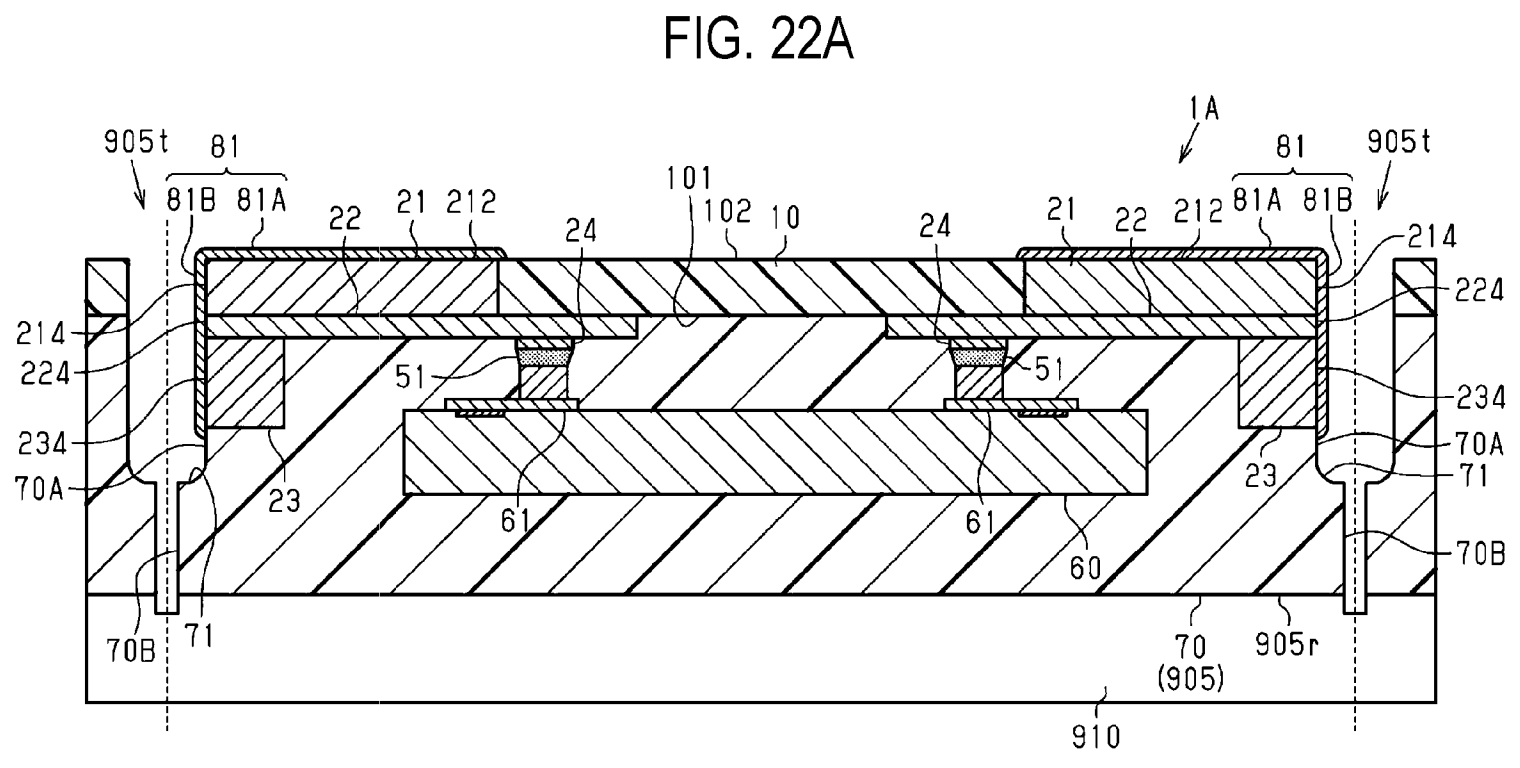
Figure 22B:
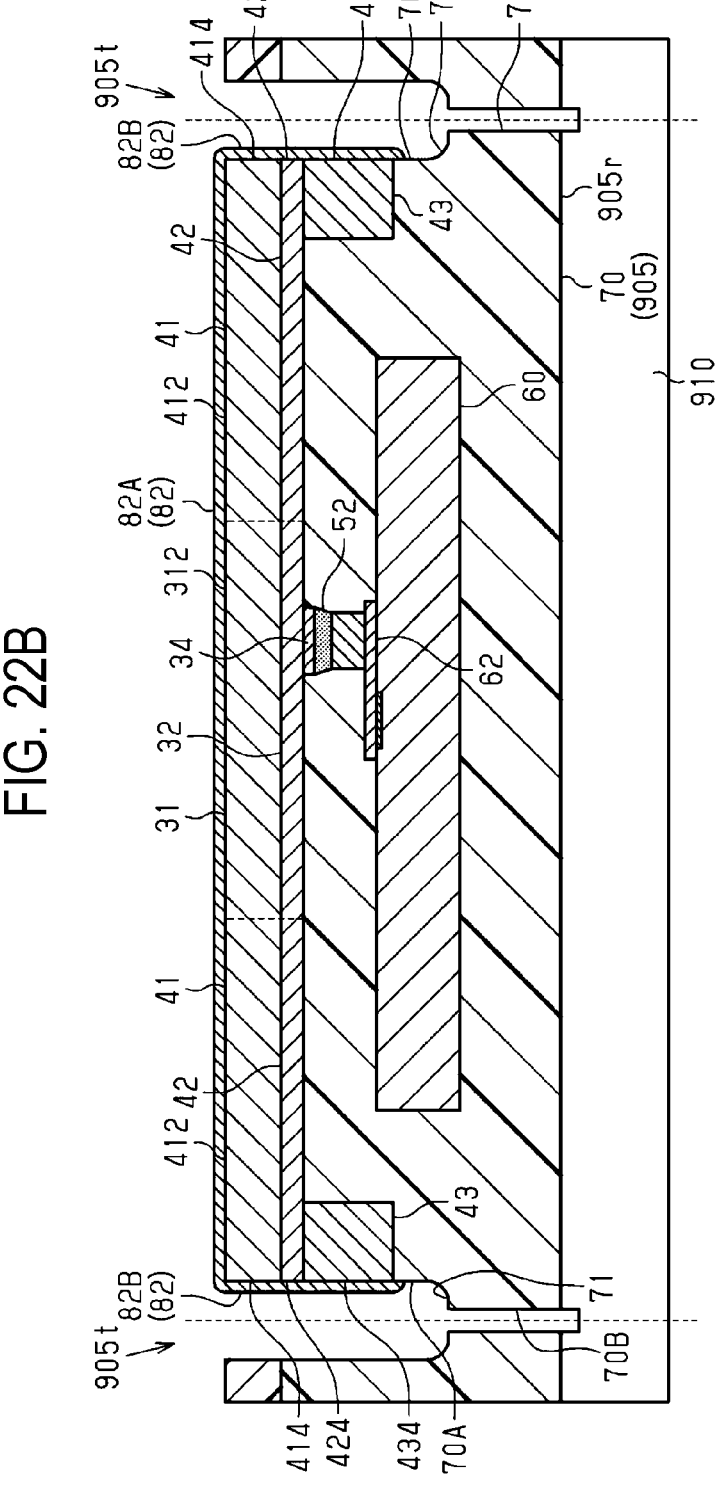
FIG. 22B is a schematic cross-sectional view showing a process of manufacturing the semiconductor device.

As shown in FIGS. 22A and 22B, the method of manufacturing the semiconductor device 1A includes a step of individualizing the semiconductor device 1A. The resin layer 905 is cut and divided into individual pieces including the semiconductor element 60 as one unit. In a division, the resin layer 905 is cut by cutting from the separation groove 905t of the resin layer 905 to the lower surface 905r of the resin layer 905 along a cutting line (broken line) with, for example, a dicing blade having a width narrower than that of the dicing blade half-cutting the resin layer 905. The individual piece is the semiconductor device 1A including the substrate 10 and the sealing resin 70. In other words, the step 71 of the resin layer 905 is formed by cutting the resin layer 905 up to the lower surface 905r of the resin layer 905 with the dicing blade having a width narrower than that of the dicing blade half-cutting the resin layer 905. As a result, the sealing resin 70 is formed. More specifically, the first resin portion 70A and the second resin portion 70B are formed as the sealing resin 70. The semiconductor device 1A is manufactured through the above-described steps.

Effects

As described above, according to this embodiment, following effects are obtained.

(1) The semiconductor device 1A includes the heat-dissipating conductive portion 30 that overlaps with at least a portion of the semiconductor element 60 when viewed from the thickness direction Z, penetrates the substrate 10 from the substrate main surface 101 to the substrate back surface 102, and has higher thermal conductivity than the substrate 10. Therefore, the semiconductor device 1A can dissipate the heat, which is generated from the semiconductor element 60, to the outside of the semiconductor device 1A toward the substrate back surface 102 of the substrate 10.

(2) The second through-electrode 31 of the heat-dissipating conductive portion 30 is a flat plate having a rectangular shape when viewed from the thickness direction Z. The second through-electrode 31 transfers the heat in the first direction X and the second direction Y orthogonal to the thickness direction Z. Therefore, the heat-dissipating conductive portion 30 can dissipate the heat more efficiently by diffusing heat, which is locally generated in the element main surface 601 of the semiconductor element 60 such as a power transistor, toward the first direction X and the second direction Y orthogonal to the thickness direction Z.

(3) The heat-dissipating conductive portion 30 is connected to the second connection pad 62 of the semiconductor element 60. The second connection pad 62 is a terminal that does not electrically affect the semiconductor element 60, and is, for example, a ground terminal. Therefore, the heat of the semiconductor element 60 can be dissipated without affecting the electrical characteristics of the semiconductor element 60.

(4) The semiconductor device 1A includes two wiring portions 40. The wiring portions 40 extend from the heat-dissipating conductive portion 30 toward the substrate side surfaces 103 and 104, respectively. The wiring portions 40 are exposed from the substrate side surfaces 103 and 104. The semiconductor device 1A includes the second external conductive film 82 that covers a surface exposed from the substrate back surface 102 and the substrate side surfaces 103 and 104 for the heat-dissipating conductive portion 30 and the wiring portions 40. The second external conductive film 82 is connected to the pattern P12 of the circuit board P10 by the solder SD2. The solder SD2 includes the fillet SD2A between the pattern P12 and the second external conductive film 82. With the fillet SD2A of the solder SD2, the mounting state between the second external conductive film 82 and the pattern P12 can be easily confirmed. Therefore, the mounting state of the semiconductor device 1A can easily be confirmed from the wiring portions 40.

(5) Each of the through-electrodes 21, 31, and 41 is made of plated metal. The through-electrodes 21, 31, and 41 are formed at the same time. Therefore, the through-electrodes 21, 31, and 41 can be efficiently formed in the process of manufacturing the semiconductor device 1A.

(6) The first external conductive film 81 and the second external conductive film 82 are made of plated metal. The external conductive films 81 and 82 are formed at the same time.

Therefore, the external conductive films 81 and 82 can be efficiently formed in the process of manufacturing the semiconductor device 1A.

MODIFICATIONS

The above embodiment can be modified, for example, as follows. The above embodiment and each of following modifications can be combined with each other as long as there is no technical conflict. In the following modifications, portions common with the above embodiment are denoted by the same reference numerals as those in the above embodiment, and explanation thereof will be omitted.

Figure 23:
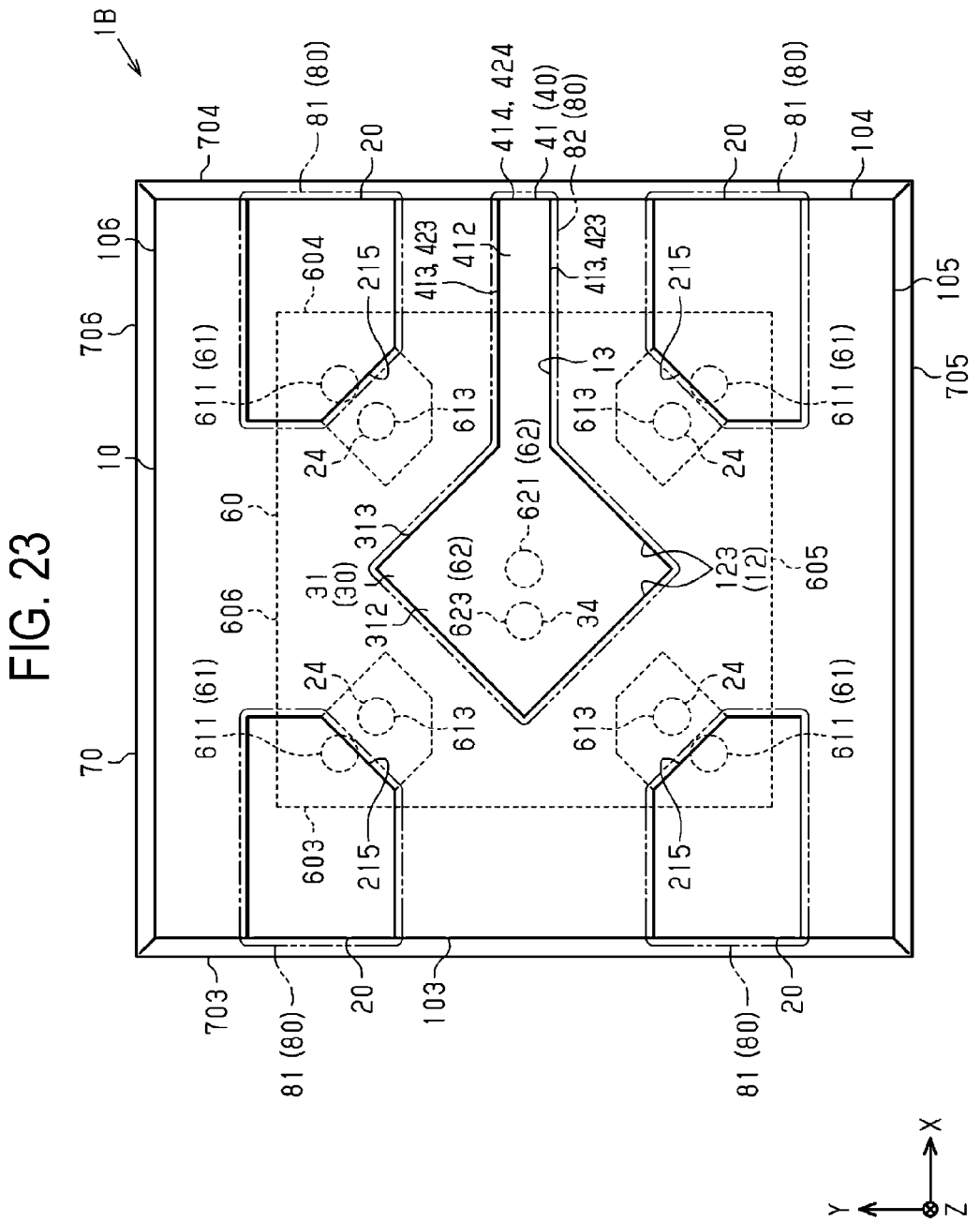
FIG. 23 is a schematic bottom view showing a semiconductor device of a modification.

The number of wiring portions 40 may be changed as appropriate. As shown in FIG. 23, a semiconductor device 1B includes one wiring portion 40. The wiring portion 40 extends toward a substrate side surface 104 among substrate side surfaces 103 and 104 facing opposite to each other in the first direction X. Further, the wiring portion 40 may be formed to extend toward the substrate side surface 103 among the substrate side surfaces 103 and 104.

Figure 24:
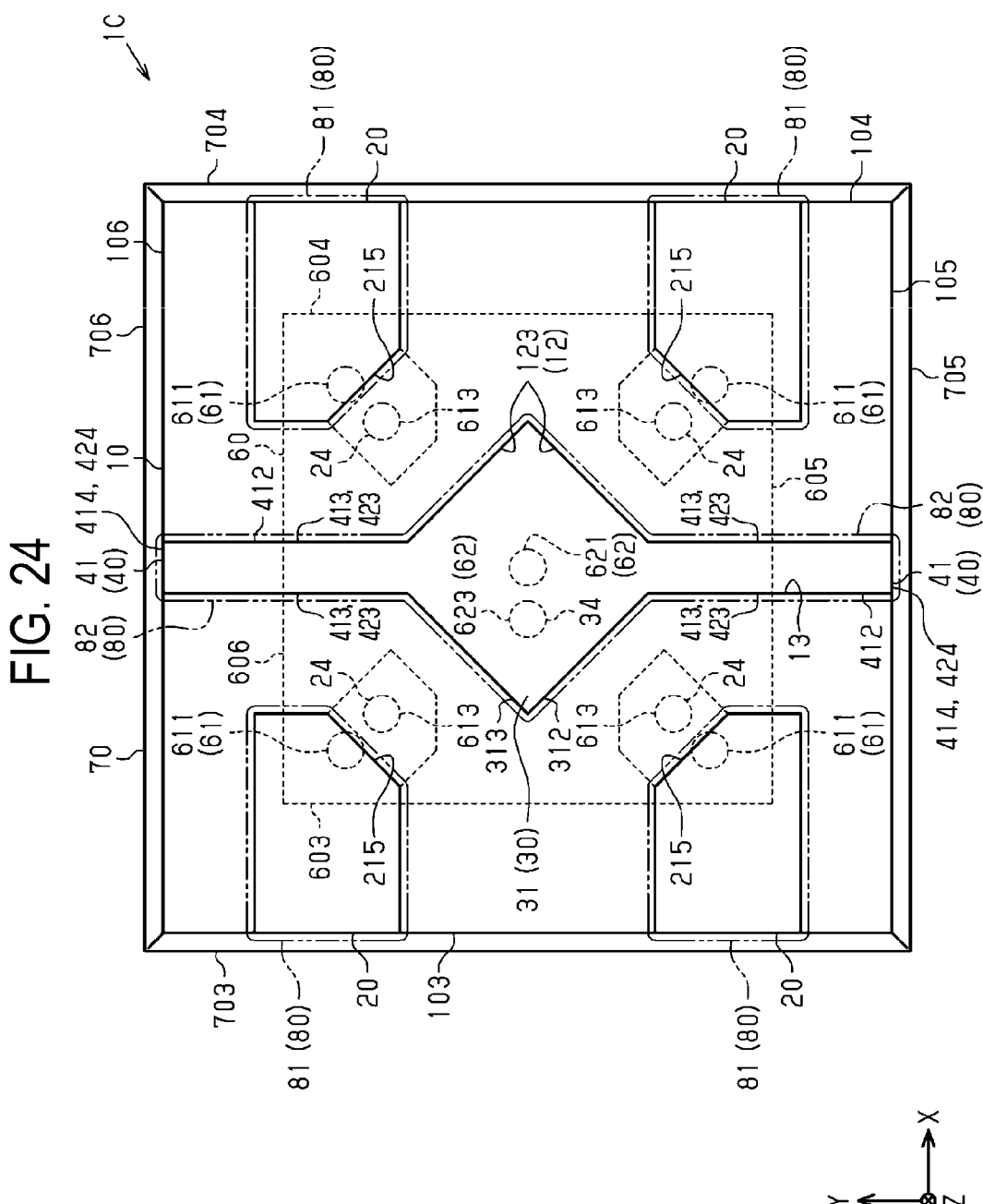
FIG. 24 is a schematic bottom view showing a semiconductor device of a modification.

A semiconductor device 1C shown in FIG. 24 includes two wiring portions 40. The wiring portions 40 are formed to extend toward substrate side surfaces 105 and 106, respectively. These substrate side surfaces 105 and 106 face opposite to each other in the second direction Y. Further, a terminal portion 20 is not exposed on the substrate side surfaces 105 and 106. That is, the wiring portions 40 are formed to extend toward the substrate side surfaces 105 and 106 on which the terminal portion 20 is not exposed.

Further, as in the semiconductor device 1B shown in FIG. 23, the wiring portion 40 may be formed to extend toward any one of the substrate side surfaces 105 and 106.

Further, a semiconductor device may be configured to include wiring portions 40 extending toward each of substrate side surfaces 103 to 106. Further, a semiconductor device may be configured to include a wiring portion 40 extending to at least one of substrate side surfaces 103 and 104 on which a terminal portion 20 is exposed, and a wiring portion 40 extending to at least one of substrate side surfaces 105 and 106 on which a terminal portion 20 is not exposed.

Figure 25:
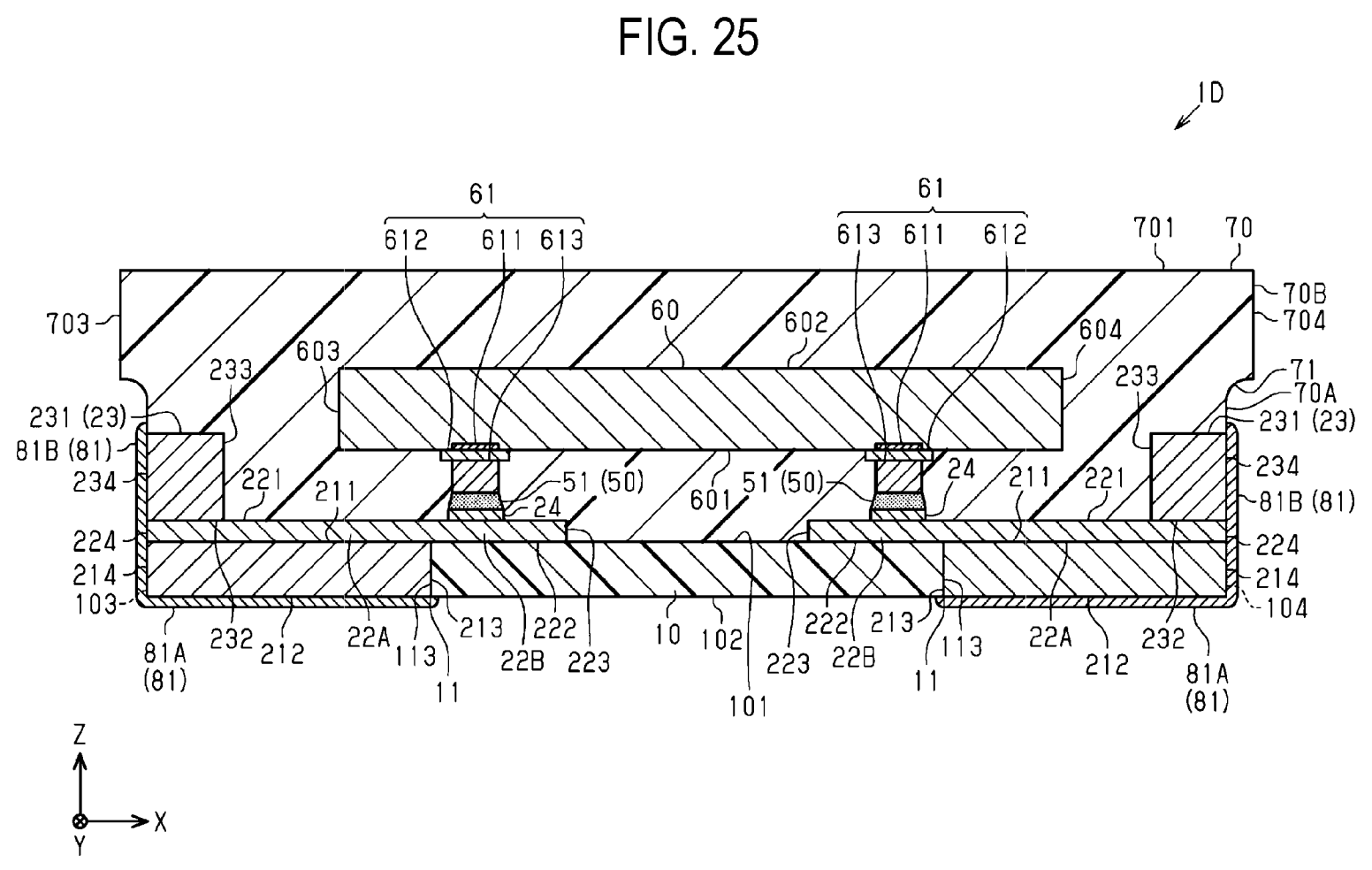
Figure 26:
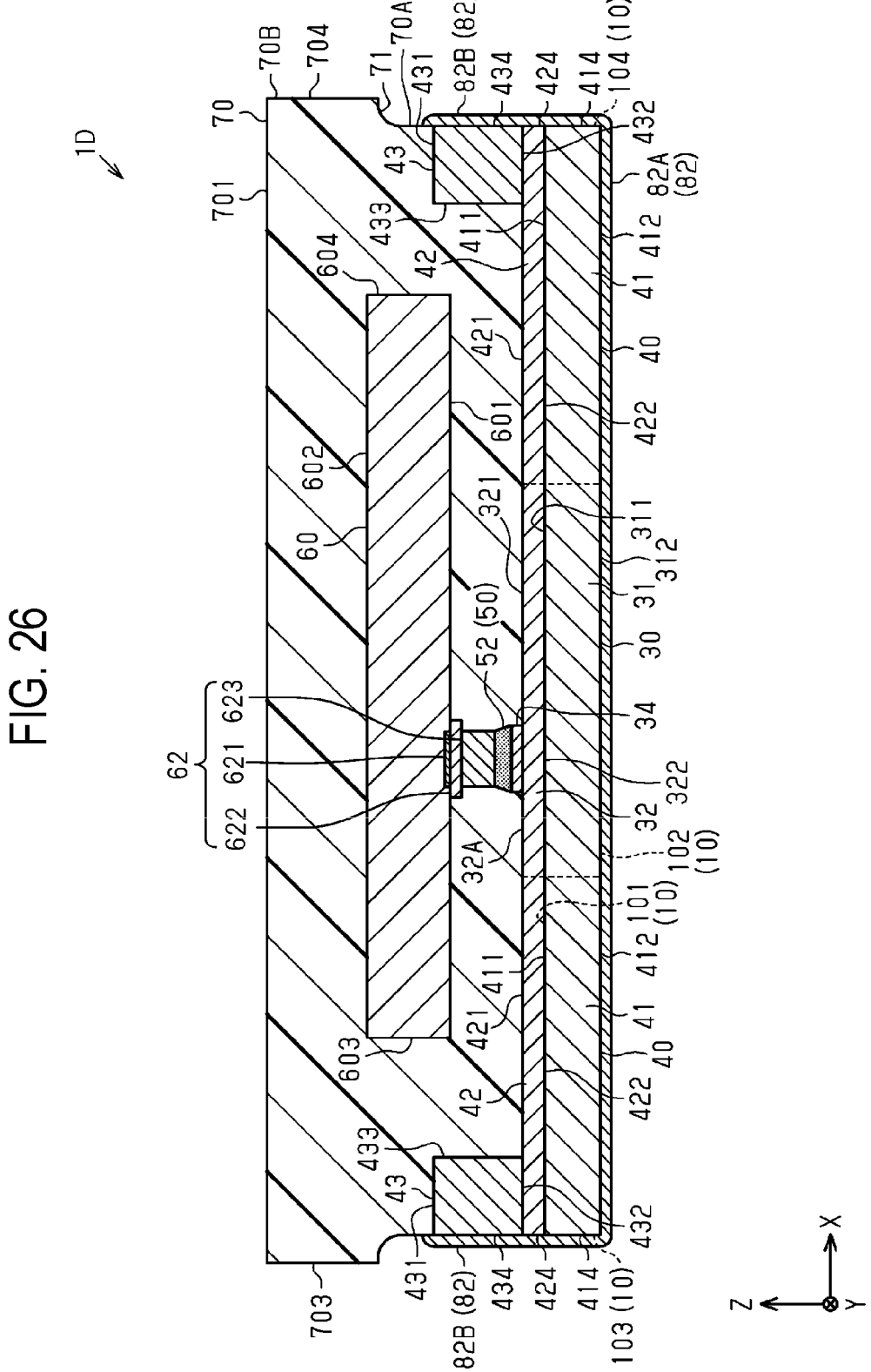
FIG. 26 is a schematic cross-sectional view showing a semiconductor device of a modification.

A configuration of the semiconductor element 60 may be modified as appropriate. In a semiconductor device 1D shown in FIGS. 25 and 26, a semiconductor element 60 is arranged so that a first electrode pad 611 and a first element electrode 613 of a first connection pad 61 overlap with each other in the thickness direction Z. In this case, the first rewiring layer 612 may be omitted. Further, the semiconductor element 60, similarly to the first connection pad 61, is arranged so that a second electrode pad 621 and a second element electrode 623 of a second connection pad 62 overlap with each other in the thickness direction Z. In this case, the second rewiring layer 622 may be omitted. Even in the semiconductor device 1D using such semiconductor element 60, the same effects as those of the above embodiment can be obtained. Further, either one of the first connection pad 61 and the second connection pad 62 may be arranged not to overlap in the thickness direction Z, as in the above embodiment.

The number and arrangement of terminal portions 20 may be changed as appropriate. In the above embodiment, the terminal portion 20 is arranged to be exposed on the substrate side surfaces 103 and 104, but a terminal portion 20 may be arranged to be exposed on the substrate side surfaces 103 to 106. Further, a terminal portion 20 may be arranged to be exposed on three of the substrate side surfaces 103 to 106.

The above description is merely an example. Those skilled in the art will appreciate that more conceivable combinations and substitutions are possible beyond the constituent elements and methods (manufacturing processes) listed for the purposes of illustrating the techniques of the present disclosure. The present disclosure is intended to include all alternatives, modifications, and changes contained within the scope of the present disclosure, including the claims.

SUPPLEMENTARY NOTES

The technical ideas that may be understood from each of the aforementioned embodiments and each of the aforementioned modifications are described below. In addition, reference numerals of the constituent elements of the embodiments corresponding to the constituent elements described in the respective supplementary notes are shown in parentheses. The reference numerals are shown as examples to assist in understanding, and the constituent elements described in the respective supplementary notes should not be limited to the constituent elements denoted by the reference numerals.

Supplementary Note 1

A semiconductor device comprising:
an electrically insulating substrate (10) including:

a substrate main surface (101) and a substrate back surface (102) facing opposite to each other in a thickness direction (Z); and
at least one substrate side surface (103 to 106) facing a direction intersecting the thickness direction (Z);
a semiconductor element (60) arranged at a side of the substrate main surface (101);
a heat-dissipating conductive portion (30, 31) that is provided at a position overlapping with at least a portion of the semiconductor element (60) when viewed from the thickness direction (Z) and is exposed from the substrate back surface (102);
a sealing resin (70) that seals the semiconductor element (60) while covering the substrate main surface (101); and
at least one wiring portion (40, 41) that is connected to the heat-dissipating conductive portion (30, 31), extends from the heat-dissipating conductive portion(30, 31) to the substrate side surface (103, 104) while being exposed from the substrate back surface (102), and is exposed from the substrate side surface (104).

Supplementary Note 2

The semiconductor device of Supplementary Note 1, wherein the at least one wiring portion includes a plurality of wiring portions (40, 41).

Supplementary Note 3

The semiconductor device of Supplementary Note 2, wherein the substrate (10) includes a pair of substrate side surfaces (103, 104), and
wherein the plurality of wiring portions (40, 41) are formed to extend toward the pair of substrate side surfaces (103, 104), respectively, which face opposite to each other.

Supplementary Note 4

The semiconductor device of Supplementary Note 2, wherein the substrate (10) includes a plurality of substrate side surfaces (103 to 106), and
wherein the wiring portion (40, 41) is formed to extend toward one (104) of the plurality of substrate side surfaces (103 to 106).

Supplementary Note 5

The semiconductor device of Supplementary Note 1 to 4, wherein the heat-dissipating conductive portion (30, 31) is arranged inside a portion of the wiring portion (40, 41) exposed from the substrate back surface (102).

Supplementary Note 6

The semiconductor device of Supplementary Note 1 to 5, wherein the heat-dissipating conductive portion (30, 31) is arranged in a central portion of the semiconductor element (60), the sealing resin (70), or the substrate (10).

Supplementary Note 7

The semiconductor device of Supplementary Note 1 to 6, wherein the heat-dissipating conductive portion (30, 31) is connected to a wiring (62) that does not affect electrical characteristics of the semiconductor element (60).

Supplementary Note 8

The semiconductor device of Supplementary Note 1 to 7, further comprising:

a terminal portion (20, 21) that is connected to the semiconductor element (60) and is exposed on the substrate back surface (102) and the substrate side surface (103, 104), wherein the wiring portion (40, 41) extends toward the substrate side surface (103, 104) on which the terminal portion (20, 21) is exposed.

Supplementary Note 9

The semiconductor device of Supplementary Note 8, wherein a width (W2) of the heat-dissipating conductive portion (30, 31) is wider than a width (W1) of the terminal portion (20, 21).

Supplementary Note 10

The semiconductor device of Supplementary Note 8 or 9, further comprising a first external conductive film (81) that covers an exposed surface of the terminal portion (20, 21).

Supplementary Note 11

The semiconductor device of Supplementary Note 10, further comprising a second external conductive film (82) that covers exposed surfaces of the heat-dissipating conductive portion (30, 31) and the wiring portion (40, 41).

Supplementary Note 12

The semiconductor device of Supplementary Note 11, wherein the first external conductive film (81) and the second external conductive film (82) are made of a same material.

Supplementary Note 13

The semiconductor device of Supplementary Note 1 to 12, wherein the substrate (10) is made of an insulating resin.

Supplementary Note 14

The semiconductor device of Supplementary Note 13, wherein the resin constituting the substrate (10) contains a same material as the sealing resin (70).

Supplementary Note 15

The semiconductor device of Supplementary Note 13, wherein the resin constituting the substrate (10) is made of a material different from that of the sealing resin (70).

Supplementary Note 16

The semiconductor device of Supplementary Note 1 to 15, wherein the sealing resin (70) is filled between the substrate (10) and the semiconductor element (60).

Supplementary Note 17

The semiconductor device of Supplementary Note 1 to 16, wherein the semiconductor element (60) includes an electrode pad (62, 621) connected to the heat-dissipating conductive portion (30, 31).

Supplementary Note 18

The semiconductor device of Supplementary Note 17, wherein the semiconductor element (60) includes:

an element wiring portion (622) connected to the electrode pad (621); and
an element electrode (623) connected to the element wiring portion (622) at a position not overlapping with the electrode pad (621) in the thickness direction (Z), and
wherein the electrode pad (621) is connected to the heat-dissipating conductive portion (30, 31) via the element wiring portion (622) and the element electrode (623).

Supplementary Note 19

The semiconductor device of Supplementary Note 17, wherein the semiconductor element (60) includes an element electrode (623) connected to the electrode pad (621), and
wherein the electrode pad (621) is connected to the heat-dissipating conductive portion (30, 31) via the element electrode (623).

According to the present disclosure in some embodiments, it is possible to provide a semiconductor device having good heat dissipation and facilitating confirmation of a mounting state.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
an electrically insulating substrate including:
a substrate main surface and a substrate back surface facing opposite to each other in a thickness direction, and
at least one substrate side surface facing a direction intersecting the thickness direction;
a semiconductor element arranged at a side of the substrate main surface;
a heat-dissipating conductive portion that is provided at a position overlapping with at least a portion of the semiconductor element when viewed from the thickness direction and is exposed from the substrate back surface;
a sealing resin that seals the semiconductor element while covering the substrate main surface;
at least one wiring portion that is connected to the heat-dissipating conductive portion, extends along the substrate back surface from the heat-dissipating conductive portion to the substrate side surface while being exposed from the substrate back surface, and is exposed from the substrate side surface;
a terminal portion that is connected to the semiconductor element and is exposed on the substrate back surface and the substrate side surface;
a first external conductive film that covers an exposed surface of the terminal portion; and
a second external conductive film that covers exposed surfaces of the heat-dissipating conductive portion and the at least one wiring portion, and
wherein the at least one wiring portion extends toward the substrate side surface on which the terminal portion is exposed.

2. The semiconductor device of claim 1, wherein the at least one wiring portion includes a plurality of wiring portions.

3. The semiconductor device of claim 2, wherein the substrate includes a pair of substrate side surfaces, and wherein the plurality of wiring portions are formed to extend toward the pair of substrate side surfaces, respectively, which face opposite to each other.

4. The semiconductor device of claim 1, wherein the substrate includes a plurality of substrate side surfaces, and wherein the wiring portion is formed to extend toward one of the plurality of substrate side surfaces.

5. The semiconductor device of claim 1, wherein the heat-dissipating conductive portion is arranged inside a portion of the wiring portion exposed from the substrate back surface.

6. The semiconductor device of claim 1, wherein the heat-dissipating conductive portion is arranged in a central portion of the semiconductor element, the sealing resin, or the substrate.

7. The semiconductor device of claim 1, wherein the heat-dissipating conductive portion is connected to a wiring that does not affect electrical characteristics of the semiconductor element.

8. The semiconductor device of claim 1, wherein a width of the heat-dissipating conductive portion is wider than a width of the terminal portion.

9. The semiconductor device of claim 1, wherein the first external conductive film and the second external conductive film are made of a same material.

10. The semiconductor device of claim 1, wherein the substrate is made of an insulating resin.

11. The semiconductor device of claim 10, wherein the resin constituting the substrate contains a same material as the sealing resin.

12. The semiconductor device of claim 10, wherein the resin constituting the substrate is made of a material different from that of the sealing resin.

13. The semiconductor device of claim 1, wherein the sealing resin is filled between the substrate and the semiconductor element.

14. The semiconductor device of claim 1, wherein the semiconductor element includes an electrode pad connected to the heat-dissipating conductive portion.

15. The semiconductor device of claim 14, wherein the semiconductor element includes:

an element wiring portion connected to the electrode pad; and an element electrode connected to the element wiring portion at a position not overlapping with the electrode pad in the thickness direction, and wherein the electrode pad is connected to the heat-dissipating conductive portion via the element wiring portion and the element electrode.

16. The semiconductor device of claim 14, wherein the semiconductor element includes an element electrode connected to the electrode pad, and wherein the electrode pad is connected to the heat-dissipating conductive portion via the element electrode.

* * * * *